United States Patent
Chung et al.

(10) Patent No.: US 9,209,089 B2
(45) Date of Patent: Dec. 8, 2015

(54) METHOD OF FABRICATING A METAL GATE SEMICONDUCTOR DEVICE

(75) Inventors: Sheng-Chen Chung, Jhubei (TW); Ming Zhu, Singapore (SG); Jyun-Ming Lin, Hsinchu (TW); Bao-Ru Young, Zhubei (TW); Hak-Lay Chuang, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 728 days.

(21) Appl. No.: 13/434,344

(22) Filed: Mar. 29, 2012

(65) Prior Publication Data
US 2013/0260547 A1  Oct. 3, 2013

(51) Int. Cl.
| | |
|---|---|
| *H01L 21/3205* | (2006.01) |
| *H01L 21/8238* | (2006.01) |
| *H01L 21/28* | (2006.01) |
| *H01L 29/49* | (2006.01) |
| *H01L 29/51* | (2006.01) |

(52) U.S. Cl.
CPC .. *H01L 21/823842* (2013.01); *H01L 21/28088* (2013.01); *H01L 21/82385* (2013.01); *H01L 21/823857* (2013.01); *H01L 29/4966* (2013.01); *H01L 29/517* (2013.01); *H01L 21/28202* (2013.01)

(58) Field of Classification Search
CPC ............... H01L 21/823857; H01L 21/823842; H01L 21/82385; H01L 21/823437; H01L 21/82345; H01L 21/823456; H01L 21/823462; H01L 27/11807

USPC .......... 257/369, 288; 438/591, 592, 694, 199, 438/588, 587
See application file for complete search history.

(56) References Cited

U.S. PATENT DOCUMENTS

| | | | | |
|---|---|---|---|---|
| 2009/0256211 | A1* | 10/2009 | Booth et al. | 257/407 |
| 2010/0048011 | A1* | 2/2010 | Yeh et al. | 438/591 |
| 2010/0178772 | A1* | 7/2010 | Lin et al. | 438/703 |

OTHER PUBLICATIONS

Jin-Aun Ng, Ming Zhu and Chi-Wen Liu; "Metal Gate Semiconductor Device;" U.S. Appl. No. 13/424,935, filed Mar. 20, 2012; 35 Pages.
Hak-Lay Chuang, Ming Zhu, Hui-Wen Lin and Bao-Ru Young; "Metal Gate Semiconductor Device and Method Of Fabricating Thereof;" U.S. Appl. No. 13/434,969, filed Mar. 30, 2012; 31Pages.

* cited by examiner

*Primary Examiner* — Thanh Y Tran
(74) *Attorney, Agent, or Firm* — Haynes and Boone, LLP

(57) ABSTRACT

A method of semiconductor device fabrication including providing a substrate having a gate dielectric layer such as a high-k dielectric disposed thereon. A tri-layer element is formed on the gate dielectric layer. The tri-layer element includes a first capping layer, a second capping layer, and a metal gate layer interposing the first and second capping layer. One of an nFET and a pFET gate structure are formed using the tri-layer element, for example, the second capping layer and the metal gate layer may form a work function layer for one of an nFET and a pFET device. The first capping layer may be a sacrificial layer used to pattern the metal gate layer.

19 Claims, 24 Drawing Sheets

METHOD OF FABRICATING A METAL GATE SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

One advancement implemented as technology nodes shrink, in some IC designs, has been the replacement of the typically polysilicon gate electrode with a metal gate electrode to improve device performance with the decreased feature sizes. One process of forming a metal gate stack is termed a "gate first" process in which the final gate stack is fabricated "first", as opposed to a replacement gate process which forms the metal gate by replacing a sacrificial gate structure. There are challenges to implementing such features and processes in CMOS fabrication however. These challenges increase for devices having different types of gate structures on a single substrate.

Thus, what is desired is a method and semiconductor device providing differently configured metal gate structures for each of NMOS and PMOS transistors formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
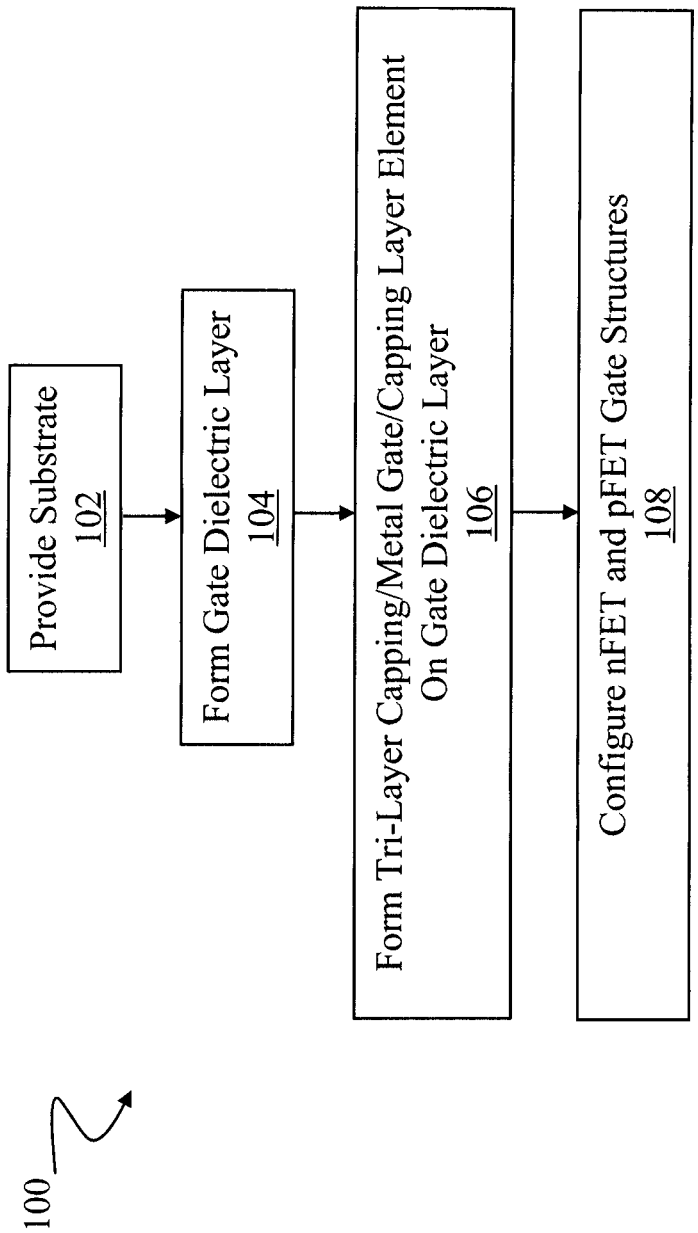
FIG. 1 is a flow chart illustrating an embodiment of fabricating a semiconductor device according to one or more aspects of the present disclosure.

Illustrated in FIG. 1 is a method 100 of fabricating a semiconductor device. The method 100 may be used to implement a metal gate structure on a hybrid semiconductor device. A hybrid semiconductor device includes a plurality of differently configured devices having differently configured gate structures (e.g., gate stacks having different layer compositions, thicknesses, etc). The differently configured gate stacks may be associated with NMOS and PMOS devices respectively. Aspects of the method 100 are described in further detail with respect to the embodiments of a method 200, described with reference to FIG. 2, and a method 15, described with reference to FIG. 15.

The method 100 begins at block 102 where a substrate is provided. The substrate may be a silicon substrate. The substrate may include various layers, including conductive or insulative layers formed on a semiconductor substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features.

The substrate may include isolation features such as a shallow trench isolation (STI), field oxide, a LOCOS feature, and/or other suitable isolation features. The isolation structure may be formed of silicon oxide, silicon nitride, silicon oxynitride, fluoride-doped silicate glass (FSG), a low-k dielectric, combinations thereof, and/or other suitable material known in the art. The isolation structures may interpose regions of the substrate each providing a different device type (e.g., pFET, nFET, I/O device, etc). Each region may be suitably doped.

The method 100 then proceeds to block 104 where a gate dielectric layer is formed on the substrate. The gate dielectric layer may include an interfacial layer and/or high-k dielectric layer formed over the substrate. The interfacial layer may include a silicon oxide layer ($SiO_2$) or silicon oxynitride (SiON). The thickness of the interfacial layer may be between approximately 5 to 10 angstroms (A). The interfacial layer may be a thermally grown oxide. A high-k dielectric layer may be formed on the interfacial layer by atomic layer deposition (ALD) or other suitable technique. The high-k dielectric layer may include a thickness ranging from approximately 10 to 40 A. The high-k dielectric layer may include hafnium oxide ($HfO_2$). Alternatively, the high-k dielectric layer may include other high-k dielectrics, such as $TiO_2$, $HfZrO$, $Ta_2O_3$, $HfSiO_4$, $ZrO_2$, $ZrSiO_2$, combinations thereof, or other suitable material. Further, the high-k gate dielectric layer may include a multiple layer configuration.

The method 100 then proceeds to block 106 where a tri-layer element is formed on the substrate. The tri-layer element may include a plurality (e.g., three) layers formed in a stack. The layers may be formed simultaneously, in-situ, and/or or separately.

In an embodiment, the tri-layer element includes a metal gate layer interposing two capping layers. In an embodiment, one or more of the layers of the tri-layer element may be an n-type or p-type layer (e.g., providing a work function for an nFET or pFET respectively).

The method 100 then proceeds to block 108 where an nFET and a pFET gate structure are configured. In an embodiment, at least one layer of the tri-layer element is provided as a layer of one of the nFET and pFET gate structures. The layer of the tri-layer element included in the gate structure may provide a work function for the gate structure. The layer may be an n-type or p-type metal layer. In an embodiment, a capping layer and a metal gate layer from the tri-layer element are included in a gate structure of a produced device. In a further embodiment, one of the capping layers may be stripped from the substrate. A first or upper capping layer of the tri-layer element may be used to pattern one or more underlying layers (e.g., metal gate layer) and subsequently removed from the substrate.

Figure 2:
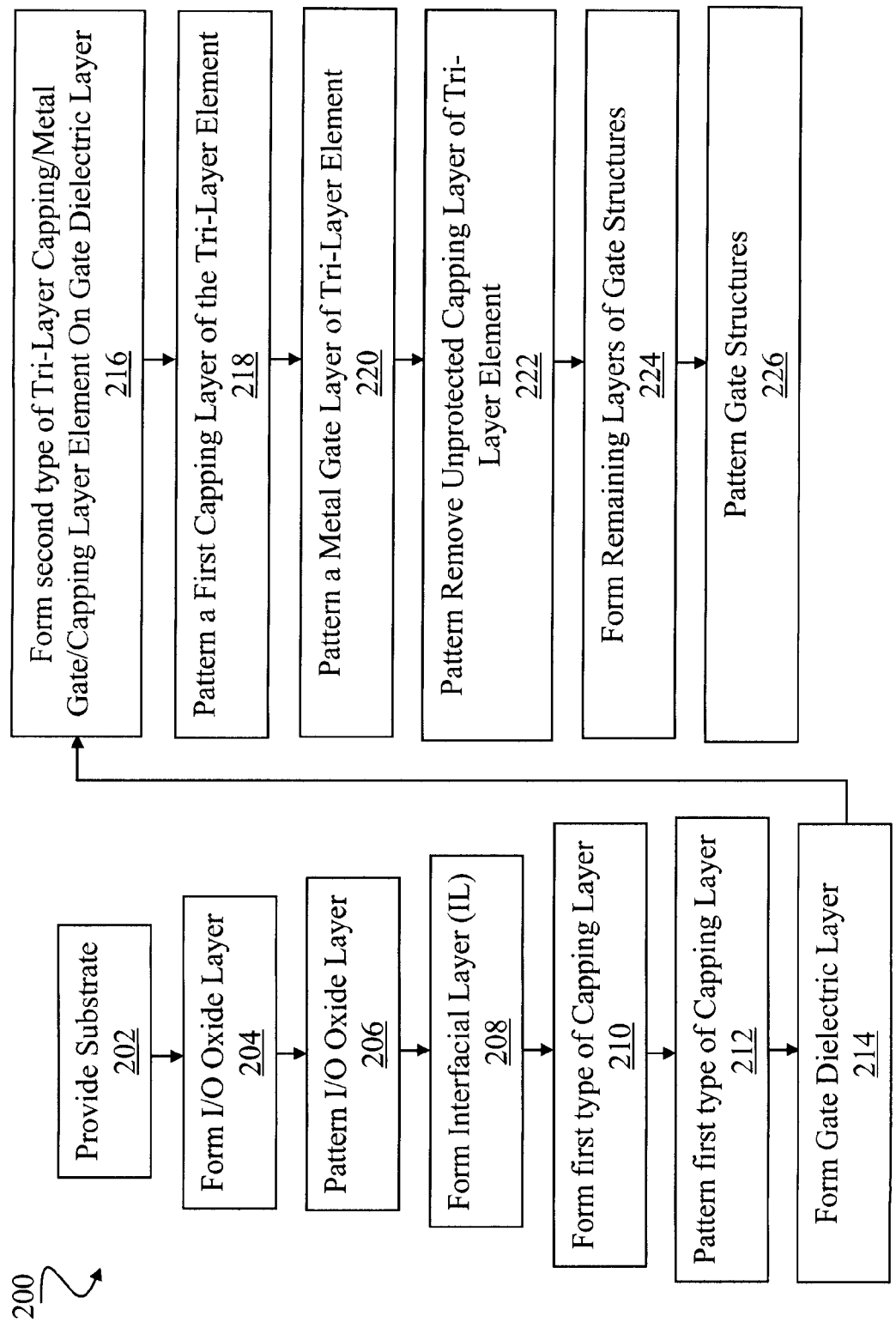
FIG. 2 is a flow chart illustrating an embodiment of the method of FIG. 1.

Referring now to FIG. 2, illustrated is a method 200 of fabricating a hybrid semiconductor device having a metal gate structure. FIGS. 3-14 are cross-sectional views of an embodiment of a semiconductor device 300 fabricating according to one or more steps of the method 200. The method 200 may be an embodiment of the method 100, described above with reference to FIG. 1.

It is understood that part of the method 200 and/or semiconductor device 300 may be fabricated by complementary metal-oxide-semiconductor (CMOS) technology process flow, and thus some processes are only briefly described herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. The semiconductor device 300 includes a plurality of semiconductor devices (e.g., transistors), which may be interconnected. The device 300 illustrates a single gate structure in each of five regions of the substrate; this is provided for simplification and ease of understanding and does not necessarily limit the embodiment to any number of gate structures, any number of regions, or any configuration of structures of regions.

The method 200 begins at block 202 where a substrate is provided. The substrate may be a silicon substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features.

The substrate may include isolation features such as a shallow trench isolation (STI), field oxide, a LOCOS feature, and/or other suitable isolation features. The isolation structure may be formed of silicon oxide, silicon nitride, silicon oxynitride, fluoride-doped silicate glass (FSG), a low-k dielectric, combinations thereof, and/or other suitable material known in the art. The isolation features may interpose regions of the substrate associated with different device types (e.g., different transistor gates). For example, the isolation features may interpose regions such as, pFET regions, nFET regions, input/output (I/O) pFET regions, I/O nFET regions, high-resistance resistor regions, and/or other suitable regions. The regions may be defined by the type of device (e.g., transistor) designed to be formed in the region. As indicated above, the reference to regions described herein is exemplary only and not intended to be limiting.

Figure 3:
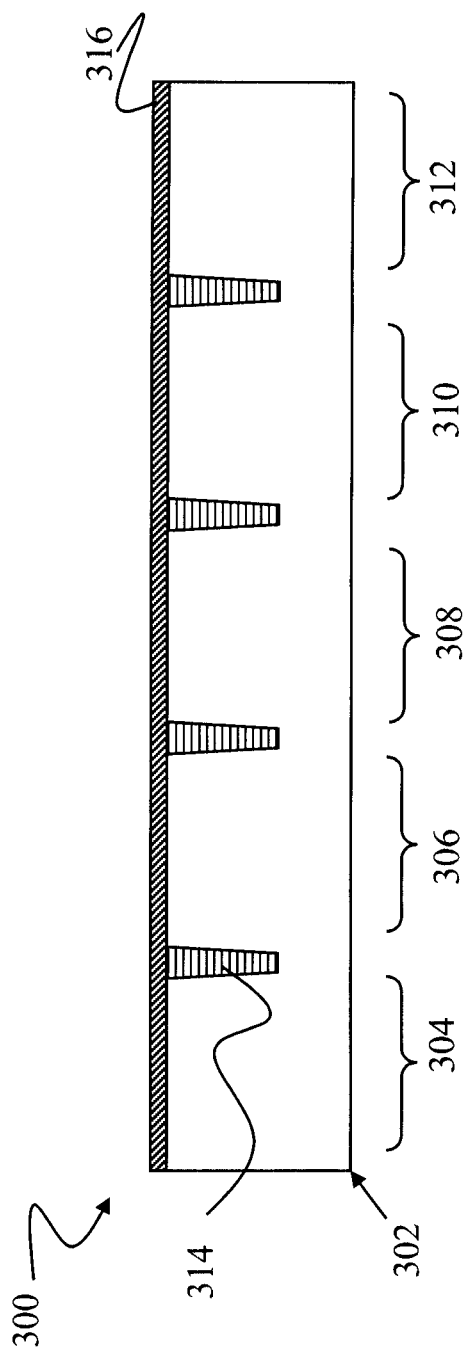
FIGS. 3-14 are cross-sectional views of a semiconductor device according to one or more steps of the method of FIG. 2.
Figure 4:
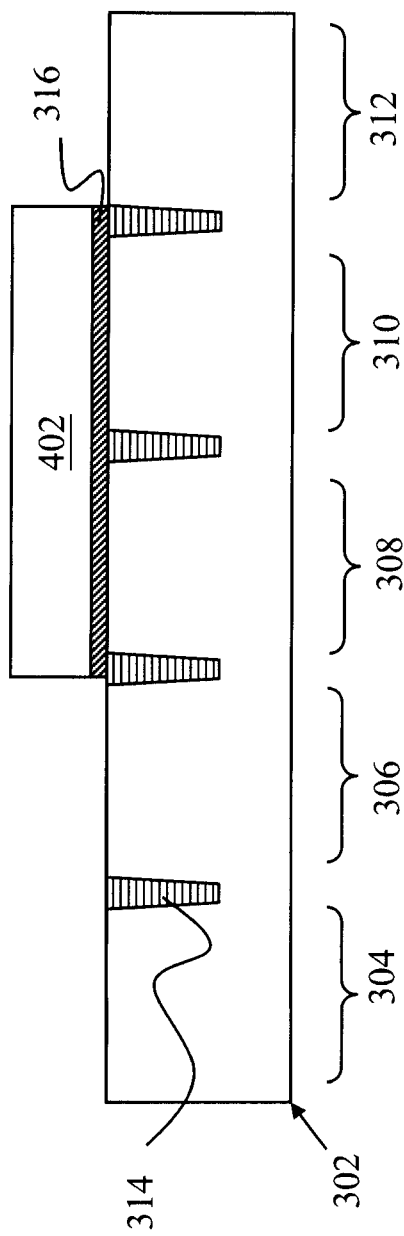
Figure 5:
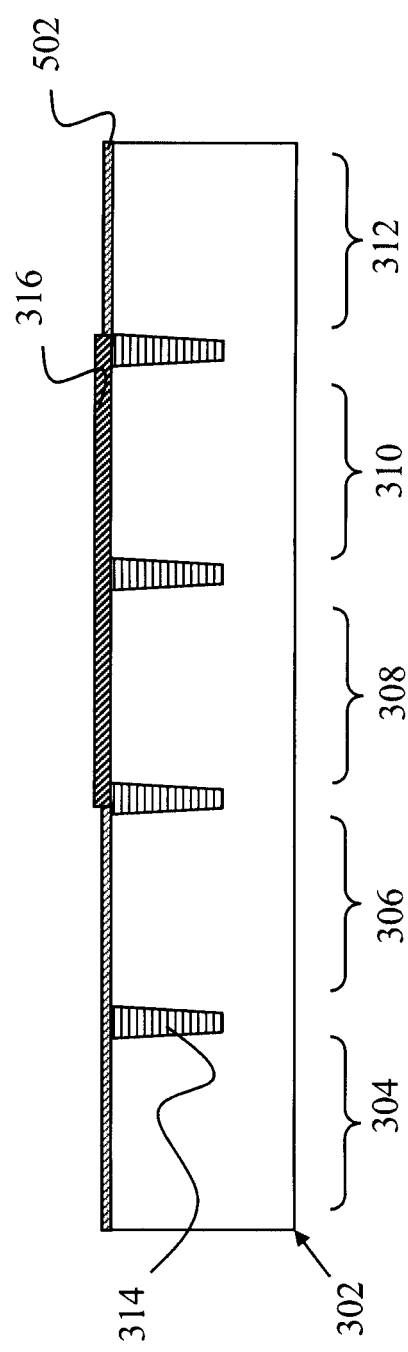

Referring to the example of FIG. 3, a substrate 302 is illustrated. The substrate 302 includes a plurality of regions 304, 306, 308, 310, and 312. In an embodiment, the first region 304 is a region in which one of an N-channel field effect transistor (nFET) and P-channel FET (pFET) device may be formed; the second region 306 is a region in which the other one of an N-channel field effect transistor (nFET) and P-channel FET (pFET) device may be formed. For example, in a further embodiment, the first region 304 provides an NMOS or nFET region; the second region 306 provides a PMOS or pFET region, or vice versa. The regions 308 and 310 may be representative of input/output device regions of the substrate 302. In an embodiment, the region 308 is a region in which one of an N-channel field effect transistor (nFET) I/O device and P-channel FET (pFET) I/O device may be formed; the region 310 is a region in which the other one of an N-channel field effect transistor (nFET) I/O device and P-channel FET (pFET) I/O device may be formed. The region 312 may provide a region where a high-resistance device (e.g., high-R FET) may be formed. The substrate 302 further includes isolation features 314. The isolation features 314 are illustrated as STI features, however other embodiments are possible.

The method 200 then proceeds to block 204 where an input/output (I/O) oxide layer is formed on the substrate. The I/O oxide layer may include silicon dioxide. In an embodiment, the I/O oxide is a thermally grown oxide. Referring to the example of FIG. 3, an I/O oxide layer 316 is formed on the substrate 302. In an embodiment, block 204 is omitted.

The method 200 then proceeds to block 206 where the I/O oxide layer is patterned. The I/O oxide layer may be patterned using suitable photolithography processes such as, depositing a photosensitive material layer, exposing the photosensitive material layer to a pattern, and developing the exposed material to form a masking element. The masking element may be used to protect an I/O region or I/O regions of the substrate, while the I/O oxide is removed from other regions. The I/O oxide may be removed using suitable etching processes such as, wet etch or dry etch processes. Referring to the example of FIG. 4, a masking element 402 overlies the first type of I/O region 308 and the second type of I/O region 310. The I/O oxide layer 316 is removed from regions 304, 306, 312 and remains on the I/O regions 308, 310. The masking element 402 may include photoresist.

The method 200 then proceeds to block 208 where an interfacial layer is formed on the substrate. The interfacial layer may include a silicon oxide layer ($SiO_2$) or silicon oxynitride (SiON). The thickness of the interfacial layer may be between approximately 5 to 10 angstroms (A). In an embodiment, the interfacial layer is grown by an oxidation process. For example, the interfacial layer may be a thermally grown oxide. In such an embodiment, the interfacial layer is formed only the exposed portions of the substrate (e.g., silicon) and the I/O oxide is not increased in thickness, nor is an interfacial layer formed on the I/O oxide. Referring to the example of FIG. 5, an interfacial layer 502 is formed on the substrate 302.

The method 200 then proceeds to block 210 where a capping layer is formed on the substrate. The capping layer may be associated with a first type of work function. In an embodiment, the capping layer is an n-type material. Exemplary n-type capping materials include lanthanum oxide or $La_xO_y$ (e.g., $La_2O_3$). In an alternative embodiment, the capping layer is a p-type material. Exemplary p-type capping materials include aluminum oxide ($Al_xO_y$). The capping layer may be less than approximately 50 Angstroms (A) in thickness. The capping layer may be formed using atomic layer deposition (ALD), physical vapor deposition (PVD), chemical vapor deposition (CVD), and/or other suitable processes. Other possible compositions of the capping layer may include LaSiO, TiAlN, TaN, TaC, TiN, TaSi, TiAl, combinations thereof, and/or other suitable material.

Figure 6:
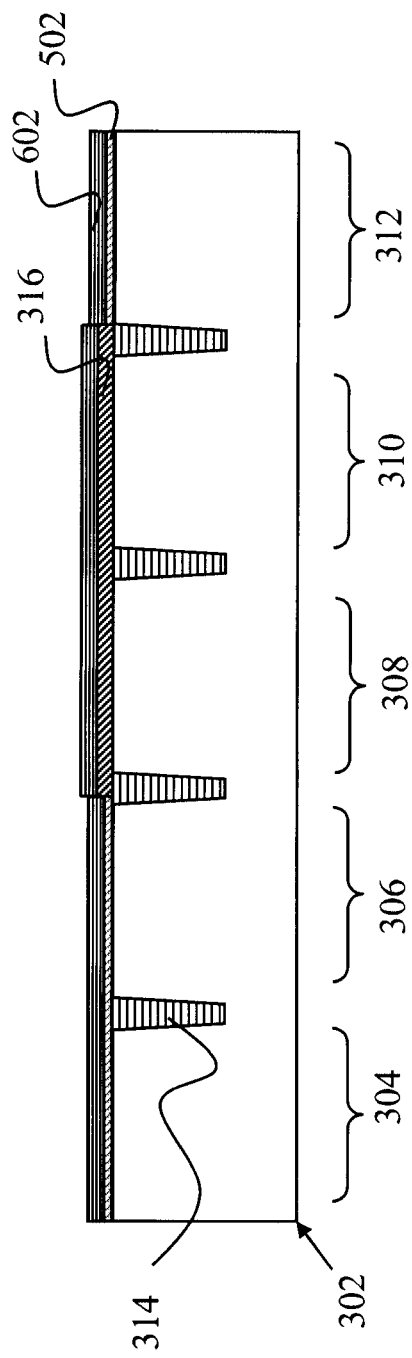

Referring to the example of FIG. 6, a capping layer 602 is formed on the substrate 302. In an embodiment, the capping layer 602 is an n-type layer such as $La_xO_y$. In another embodiment, the capping layer 602 is a p-type layer such as $Al_xO_y$.

The method 200 then proceeds to block 212 where the capping layer of the first type is patterned. The capping layer may be patterned using suitable photolithography processes such as, depositing a photosensitive material layer, exposing the photosensitive material layer to a pattern and developing the exposed material to form a masking element. The masking element may be used to protect one type of region (e.g., the region(s) for the formation of one of nFET or pFET devices), while the capping layer is removed from other region(s) (e.g., the regions for the formation of the other one of nFET or pFET devices). The capping layer may be removed using suitable etching processes such as, wet etch or dry etch processes.

Figure 7:
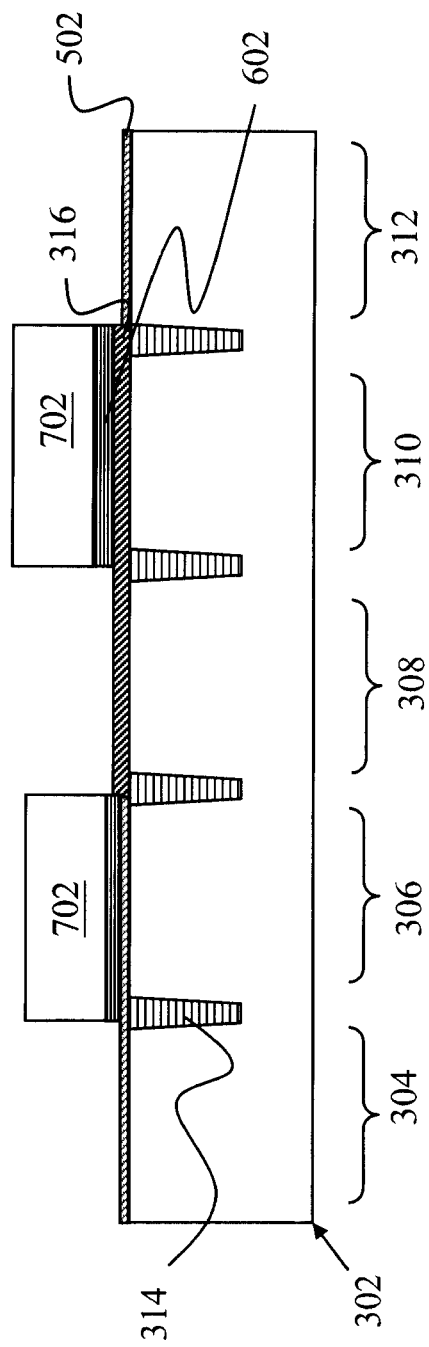
Figure 8:
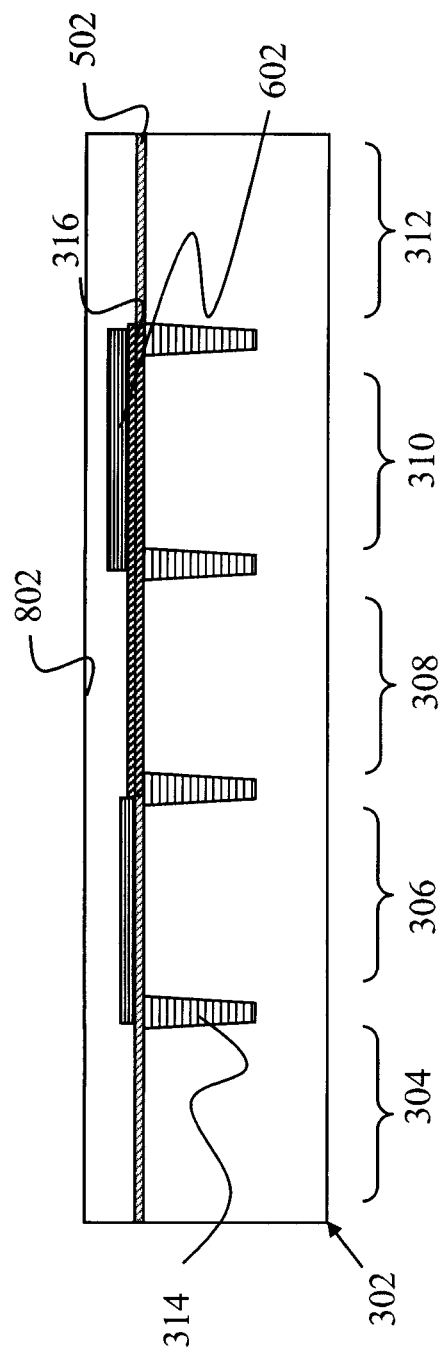

Referring to the example of FIG. 7, a masking element 702 overlies the region 306 and the region 310. In an embodiment, the regions 306 and 310 are associated with a first type of device, while regions 304 and 308 are associated with a second type of device. For example, in an embodiment, region 306 is an nFET device region and region 310 is an I/O nFET device region. In another embodiment, region 306 is a pFET device region and region 310 is an I/O pFET device region. The capping layer 602 is removed from regions 304, 308, and 312. Thus, the capping layer 602 may be selected with a composition beneficial to the devices formed in the relevant regions. The masking element 702 may include photoresist.

The method 200 then proceeds to block 214 where a gate dielectric layer is formed on the substrate. In an embodiment, the gate dielectric layer is a high-k dielectric material. The gate dielectric material may be formed by atomic layer deposition (ALD) or other suitable technique. The gate dielectric layer may include a thickness ranging from approximately 10 to 40 A. The gate dielectric layer may include hafnium oxide ($HfO_2$). Alternatively, the layer may include other high-k dielectrics, such as $TiO_2$, HfZrO, $Ta_2O_3$, $HfSiO_4$, $ZrO_2$, $ZrSiO_2$, combinations thereof, and/or other suitable material. Further, the gate dielectric layer may include a multiple layer configuration. The formation of the gate dielectric layer may include treating the as-deposited layer, for example, with a post-nitridation annealing (PNA), direct plasma nitridation (DPN), and/or other suitable treatment processes that may improve the quality of the dielectric layer. Referring to the example of FIG. 8, a gate dielectric layer 802 is formed on the substrate 302. In an embodiment, the gate dielectric layer 802 is a high-k dielectric.

The method 200 then proceeds to block 216 where a tri-layer element is formed on the gate dielectric layer. The tri-layer element may be substantially similar to as discussed above with reference to block 106 of the method 100, described with respect to FIG. 1. The tri-layer element may include a metal gate layer interposing two capping layers. In an embodiment, the tri-layer element is associated with a second type of work function (e.g., opposite the capping layer of block 210). The metal gate layer may also be referred to as a work function layer.

In an embodiment, the tri-layer element includes a first (or lower) p-type (pFET) capping layer, a metal gate and a second (or upper) p-type (pFET) capping layer. Exemplary compositions for the p-type capping layer include $Al_xO_y$, such as $Al_2O_3$. Exemplary compositions for a metal gate layer include TiN. Alternative compositions include TaN, $ZrSi_2$, $MoSi_2$, $TaSi_2$, $NiSi_2$, WN, or other suitable material. However, other type of P work function metal (p-metal) compositions may be used. P-type metal materials include compositions such as ruthenium, palladium, platinum, cobalt, nickel, and conductive metal oxides, and/or other suitable materials.

In another embodiment, the tri-layer element includes a first (or upper) n-type (nFET) capping layer, a metal gate and a second (or upper) n-type (nFET) capping layer. Exemplary compositions for the n-type capping layer include $La_xO_y$ such as $La_2O_3$. Exemplary compositions for a metal gate layer include TiN. Alternative compositions of the metal gate layer may include TiN, TaN, $ZrSi_2$, $MoSi_2$, $TaSi_2$, $NiSi_2$, WN, or other suitable material. However, other type of N work function metal (n-metal) may be used. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

The tri-layer element may be formed using atomic layer deposition (ALD), physical vapor deposition (PVD), chemical vapor deposition (CVD), and/or other suitable process. The thickness of each capping layer may be less than approximately 50 A. The thickness of the metal gate layer may be less than approximately 200 A.

Figure 9:
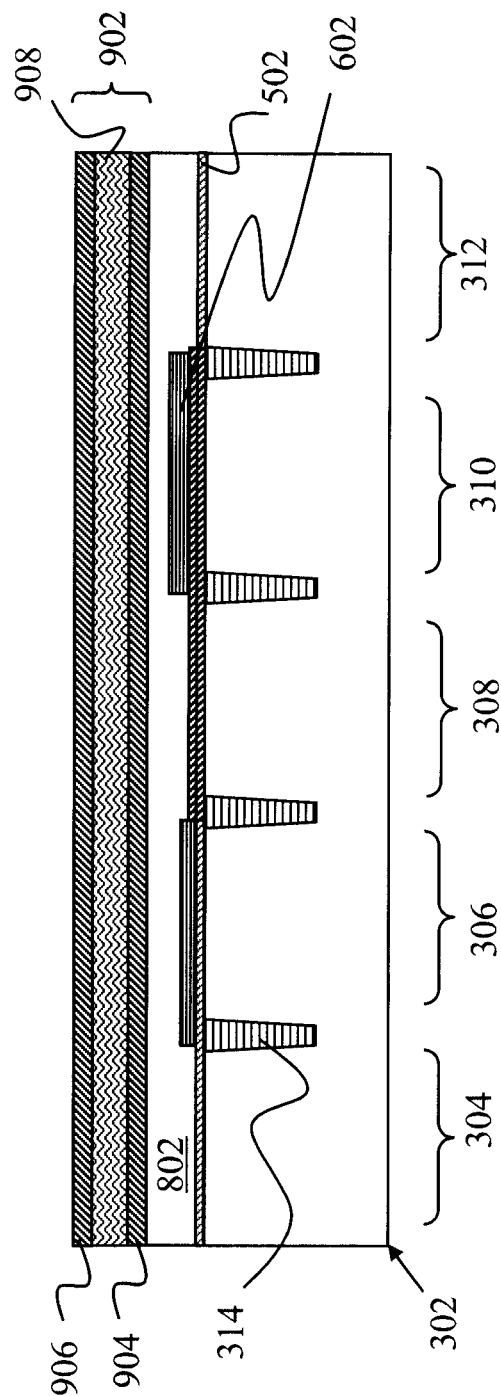

Referring to the example of FIG. 9, a tri-layer element 902 is disposed on the substrate 302. The tri-layer element 902 includes a capping layer 904 and a capping layer 906; a metal gate layer 908 interposes the capping layers 904 and 906.

In an embodiment, the capping layer 602 is a pFET capping layer (e.g., $Al_xO_y$) and the capping layers 904 and 906 are nFET capping layers (e.g., $La_xO_y$). In another embodiment, the capping layer 602 is an nFET capping layer (e.g., $La_xO_y$) and the capping layers 904 and 906 are pFET capping layers (e.g., $Al_xO_y$).

The method 200 then proceeds to block 218 where an upper capping layer of the tri-layer element is patterned. The upper capping layer of the tri-layer element may be patterned using suitable photolithography processes such as, depositing a photosensitive material layer, exposing the photosensitive material layer to a pattern, and developing the exposed material to form a masking element. The masking element may be used to protect one type of region (e.g., the region(s) for the formation of one of nFET or pFET devices), while the upper capping layer is removed from other region(s) (e.g., the regions for the formation of the other one of nFET or pFET devices). The upper capping layer may be removed using suitable etching processes such as wet etch or dry etch processes.

Figure 10:
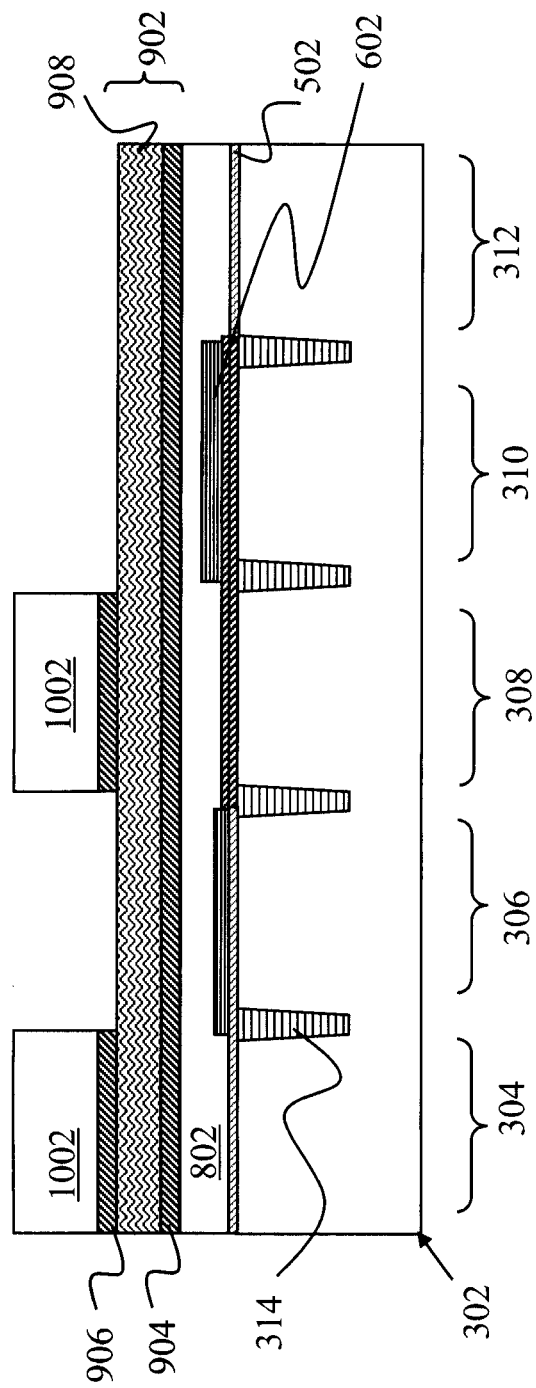

Referring to the example of FIG. 10, a masking element 1002 is formed on the capping layer 906 and overlies the region 304 and the region 308. In an embodiment, the regions 304 and 308 are associated with a first type of device, while regions 306 and 310 are associated with a second type of device. For example, in an embodiment, region 306 is an nFET device region and region 310 is an I/O nFET device region. In another embodiment, region 306 is a pFET device region and region 310 is an I/O pFET device region. The first capping layer 906 is removed from regions 306, 310, and 312. The masking element 1002 may include photoresist.

The method 200 then proceeds to block 220 where a metal gate layer of the tri-layer element is patterned. The metal gate layer may be patterned using the overlying capping layer as a masking element. In an embodiment, a photosensitive material used to pattern the upper capping layer of the tri-layer element, described above with reference to block 218, is removed from the substrate. Thereafter, the metal gate layer is patterned (e.g., etched) using the remaining patterned first capping layer as a masking element. The metal gate layer may be patterned using suitable wet etch, dry etch, plasma etch, and/or other suitable processes. The patterned metal gate layer may overlie regions of the substrate having a first device type (e.g., one of nFET or pFET), while the metal gate layer is removed from regions of the substrate having a second device type (e.g., the other one of pFET and nFET).

Figure 11:
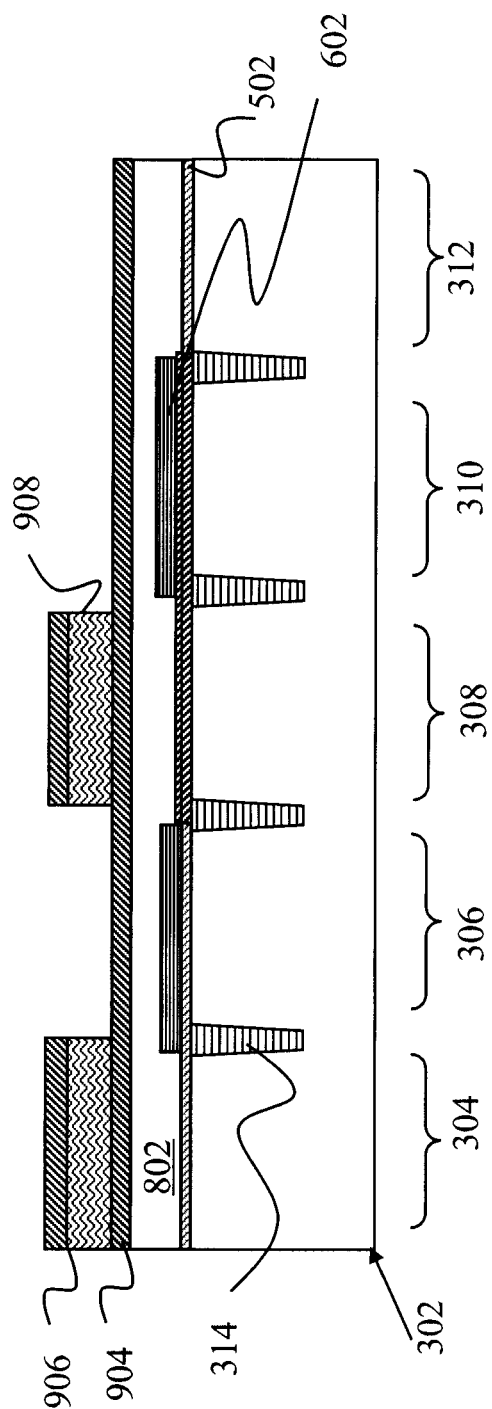

Referring to the example of FIG. 11, the metal gate layer 908 is patterned. The metal gate layer 908 may be patterned using the patterned first capping layer 906 as a masking element. Thus, the metal gate layer 908 now overlies regions 304 and 308, and has been removed from other regions of the substrate 302, including regions 306 and 310. In an embodiment, the regions 306 and 310 are associated with a first type of device, while regions 304 and 308 are associated with a second type of device. For example, in an embodiment, region 306 is an nFET device region and region 310 is an I/O nFET device region; region 304 is a pFET device region and region 308 is an I/O pFET region. In another embodiment, region 306 is a pFET device region and region 310 is an I/O pFET device region; region 304 is an nFET device region and region 308 is an I/O nFET region. Thus, the metal gate layer 908 may be selected with a composition beneficial to the devices formed in the relevant regions.

The method 200 then proceeds to block 222 where an unprotected portion of the capping layer(s) of the tri-layer element is removed from the substrate. In an embodiment, the remaining portion of a first capping layer (e.g., top layer) of the tri-layer element is stripped from the substrate. In an embodiment, a second capping layer (e.g., bottom layer) of the tri-layer element is stripped from the substrate in the regions in which the metal gate layer is not overlying the second capping layer, in other words, where the second capping layer is unprotected or exposed. The second capping layer may be removed by a wet etch process. In an embodiment, a top capping layer of the tri-layer element is removed from regions of a first type (e.g., one of nFET and pFET regions), while the bottom capping layer of the tri-layer element is removed from the regions of a second type (e.g., the other one of the nFET and pFET regions). The removal may be provided substantially simultaneously (e.g., with a single wet etch process).

Figure 12:
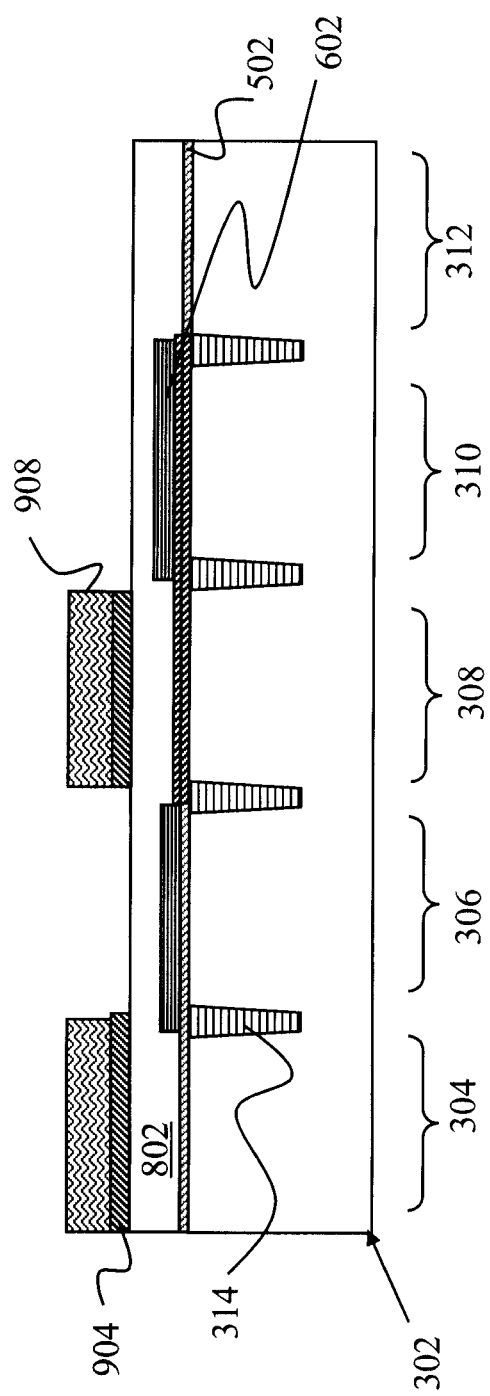
Figure 13:
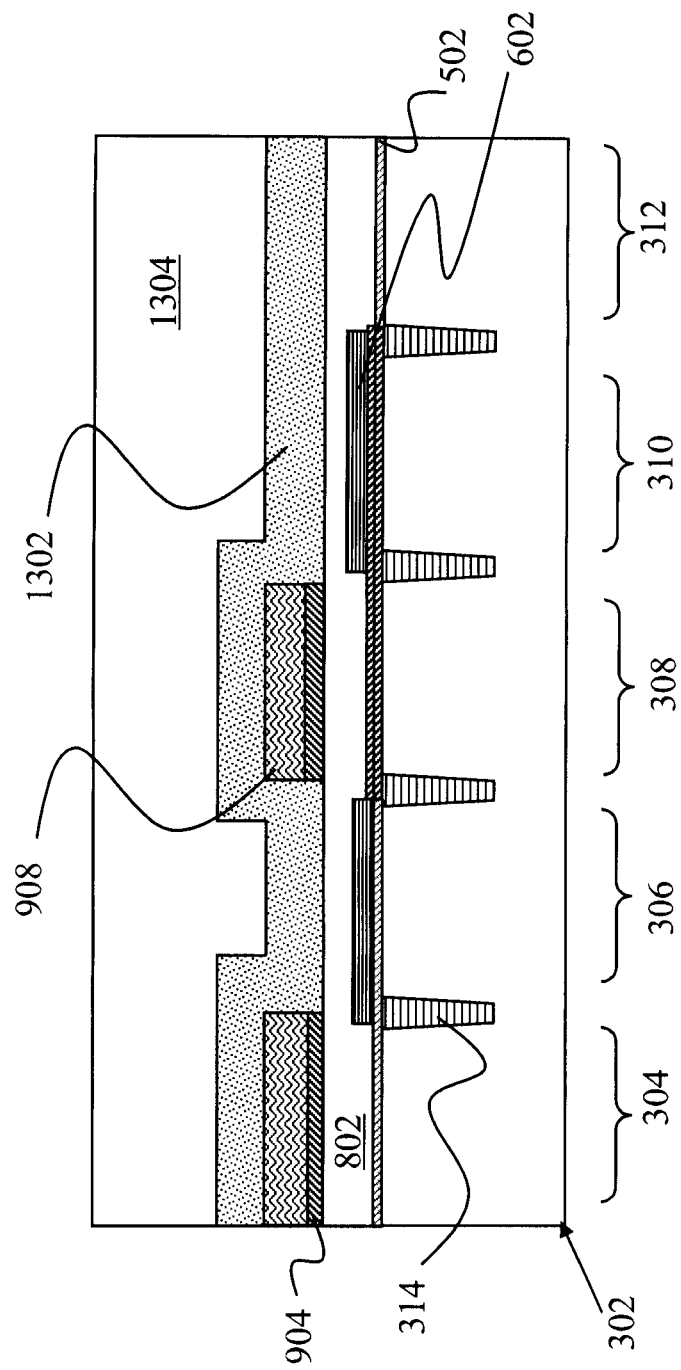

Referring to the example of FIG. 12, the capping layer 906 has been removed from the substrate 302. The capping layer 904 and the metal gate layer 908 are disposed on the substrate in regions 304 and 308. As described above, in an embodiment, the regions 306 and 310 are associated with a first type of device, while regions 304 and 308 are associated with a second type of device. For example, in an embodiment, region 306 is an nFET device region and region 310 is an I/O nFET device region; region 304 is a pFET device region and region 308 is an I/O pFET region. In another embodiment, region 306 is a pFET device region and region 310 is an I/O pFET device region; region 304 is an nFET device region and region 308 is an I/O nFET region. Thus, the metal gate layer 908 may be selected with a composition beneficial to the devices formed in the relevant regions.

The method 200 then proceeds to block 224 where the remaining layers of the gate structure(s) are formed. The layers formed may include work function layers, polysilicon layers, and/or other suitable layers. In an embodiment, the work function layer may be a metal gate layer associated with a different device type than the metal gate layer of the tri-layer element. For example, in an embodiment, the tri-layer element is associated with an nFET and includes n-metal, and the work function layer of block 224 is associated with a pFET and includes a p-metal. In another embodiment, the tri-layer element is associated with a pFET and includes p-metal, and the work function layer of block 224 is associated with an nFET and includes an n-metal. Exemplary compositions for the work function layer may include TiN, TaN, $ZrSi_2$, $MoSi_2$, $TaSi_2$, $NiSi_2$, WN, and/or other suitable material. The polysilicon layer may be a sacrificial layer, or may remain on the substrate to form a portion of the gate structure. Referring to the example of FIG. 13, a work function layer 1302 and a polysilicon layer 1304 are formed on the substrate 302.

The method 200 then proceeds to block 226 where the gate structures are patterned. The gate structures may be patterned using suitable photolithography processes such as, depositing a photosensitive material layer, exposing the photosensitive material layer to a pattern, and developing the exposed material to form a masking element. The underlying layers are then etched to form gate structures.

In an embodiment, forming the gate structures includes depositing a hard mask layer on the gate stack layers. The hard mask may be formed by a deposition process or other suitable process. The hard mask may include silicon nitride, silicon oxynitride, silicon carbide, and/or other suitable material. The hard mask may include a thickness ranging from approximately 100 to about 300 A. Referring to the example of FIG. 14, a hard mask layer 1402 is formed on the gate layers.

Figure 14:
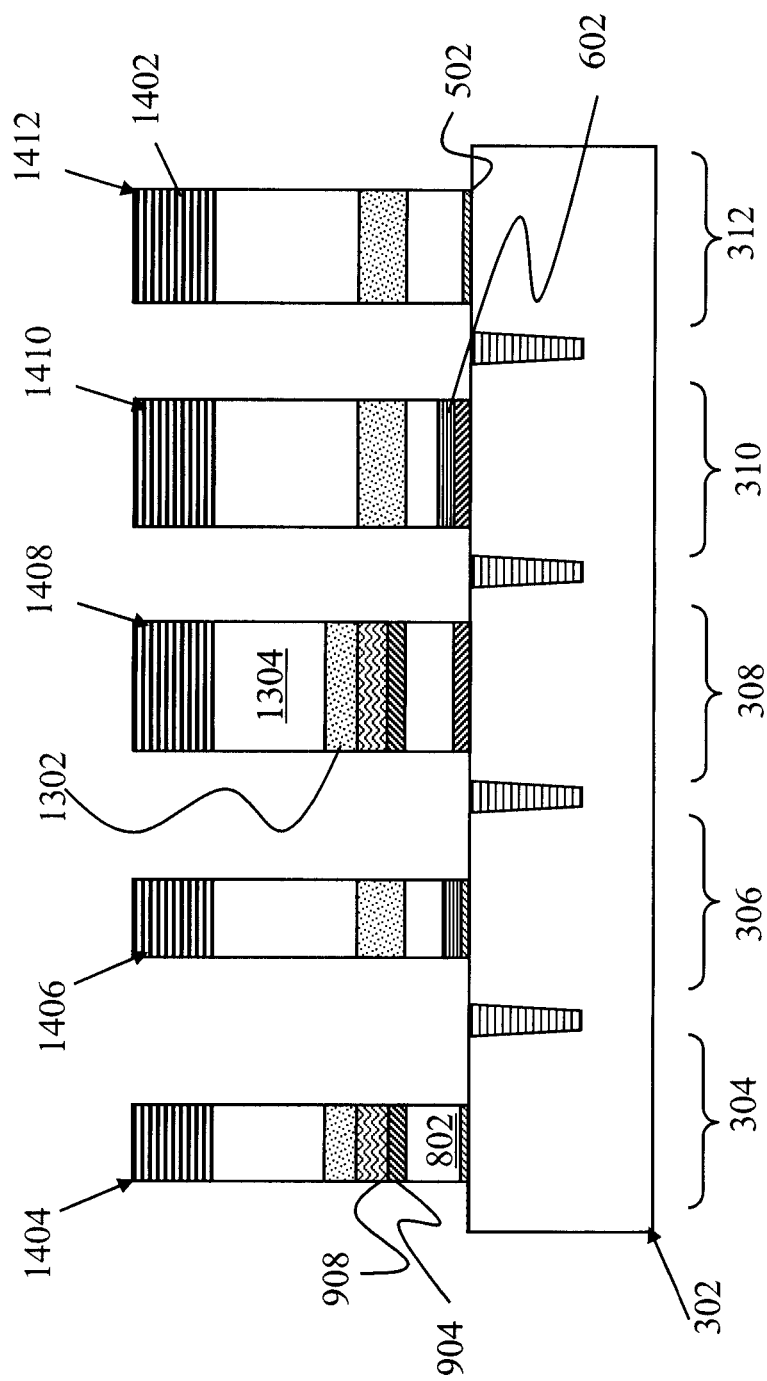

FIG. 14 also illustrates a plurality of gate structures 1404, 1406, 1408, 1410, and 1412. In an embodiment, gate structure 1404 and gate structure 1408 are associated with a first device type; gate structures 1406 and gate structures 1410 are associated with a second device type. In an embodiment, the first device type is one of nFET and pFET and the second device type is the other of nFET and pFET. In an embodiment, the gate structures 1408 and 1410 are associated with input/output devices. The gate structure 1412 may be associated with a high resistance resistor.

The device 300 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 200 may continue to provide other features and elements fabricated by CMOS process technology flow. For example, source/drain regions associated with each of the gate structures may be formed. Interlayer dielectric (ILD) layers may be formed on the substrate on the source/drain regions and interposing the gate structures. The substrate may be planarized, the hard mask removed, and further exemplary processes that may be performed include the formation of contact features coupled to the gate structures and a multilayer interconnect (MLI) structure having via and interconnect lines that may interconnect one or more gate structures or semiconductor devices formed on the substrate. It is noted that the method 200 may be describes as a portion of a gate-first process of fabricating metal gates. However, one of ordinary skill in the art may recognize aspects of the method 200 that benefit a replacement gate, or gate last process.

Figure 15:
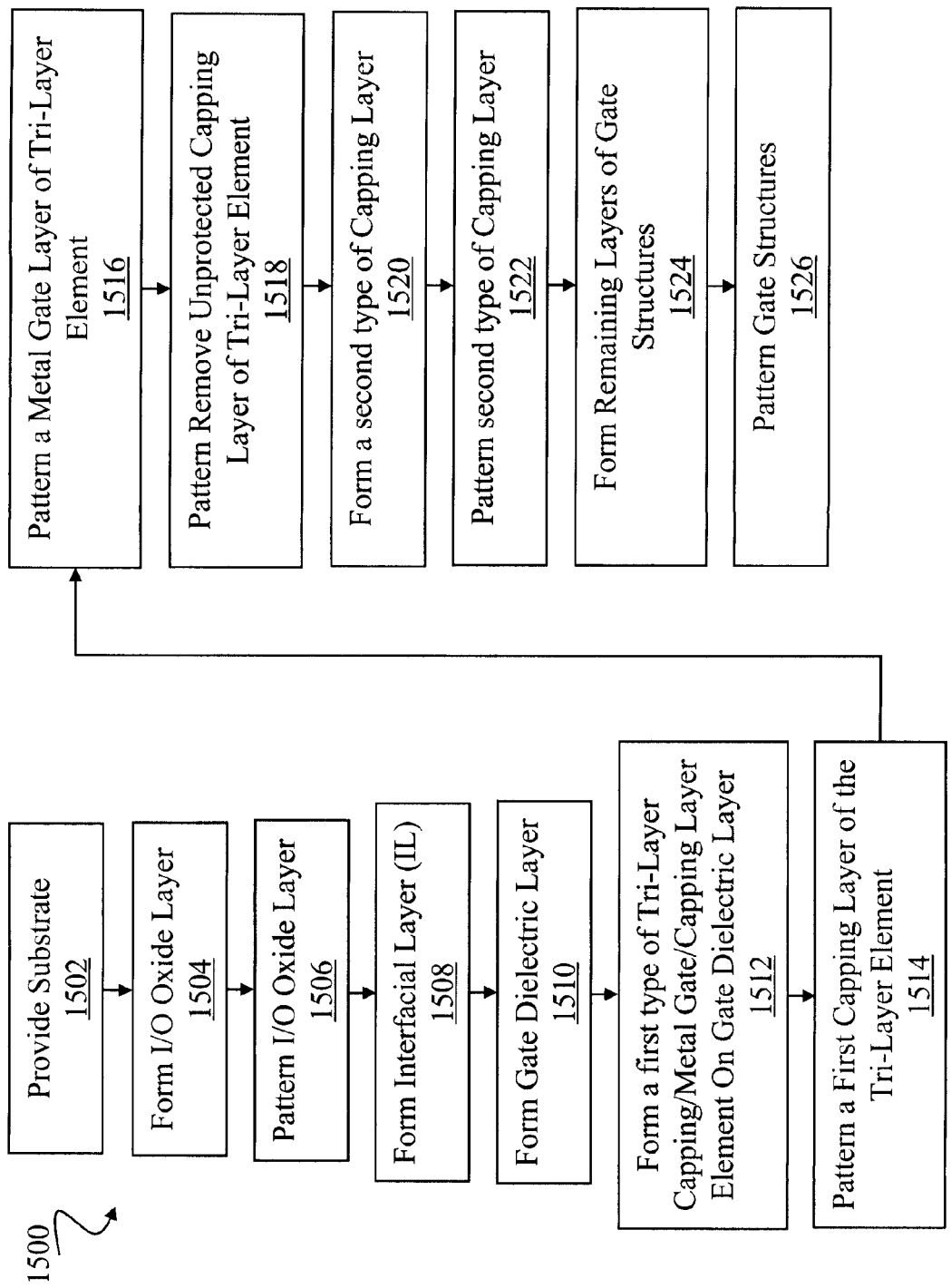
FIG. 15 is a flow chart illustrating another embodiment of the method of FIG. 1.

Referring now to FIG. 15, illustrated is a method 1500 of fabricating a hybrid semiconductor device having a metal gate structure. FIGS. 16-24 are cross-sectional views of an embodiment of a semiconductor device 1600 fabricating according to one or more steps of the method 1500. The method 1500 may be an embodiment of the method 100, described above with reference to FIG. 1.

It is understood that part of the method 1500 semiconductor device 1600 may be fabricated by complementary metal-oxide-semiconductor (CMOS) technology process flow, and thus some processes are only briefly described herein. Further, the semiconductor device 1600 may include various other devices and features, such as additional transistors, bipolar junction transistors, resistors, capacitors, diodes, fuses, etc., but is simplified for a better understanding of the inventive concepts of the present disclosure. The semiconductor device 1600 includes a plurality of semiconductor devices (e.g., transistors), which may be interconnected. The device 1600 illustrates a single gate structure in each of five regions of the substrate; this is provided for simplification and ease of understanding and does not necessarily limit the embodiment to any number of gate structures, any number of regions, or any configuration of structures of regions.

The method 1500 begins at block 1502 where a substrate is provided. The substrate may be a silicon substrate. The substrate may include various doping configurations depending on design requirements as is known in the art. The substrate may also include other elementary semiconductors such as germanium and diamond. Alternatively, the substrate may include a compound semiconductor and/or an alloy semiconductor. Further, the substrate may optionally include an epitaxial layer (epi layer), may be strained for performance enhancement, may include a silicon-on-insulator (SOI) structure, and/or have other suitable enhancement features.

The substrate may include isolation features such as a shallow trench isolation (STI), field oxide, a LOCOS feature, and/or other suitable isolation features. The isolation structure may be formed of silicon oxide, silicon nitride, silicon oxynitride, fluoride-doped silicate glass (FSG), a low-k dielectric, combinations thereof, and/or other suitable material known in the art. The isolation features may interpose regions of the substrate associated with different device types (e.g., different transistor gates). For example, the isolation features may interpose regions such as, pFET regions, nFET regions, input/output (I/O) pFET regions, I/O nFET regions, high-resistance resistor regions, and/or other suitable regions. The regions may be defined by the type of device (e.g., transistor) designed to be formed in the region. As indicated above, the reference to regions described herein is exemplary only and not intended to be limiting.

Figure 16:
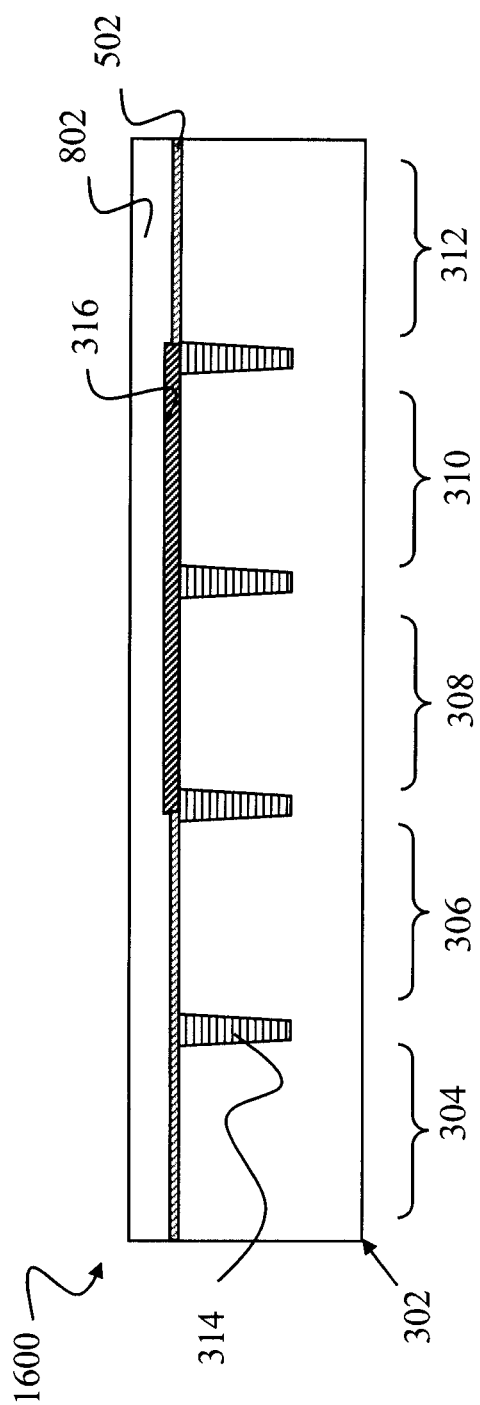
FIGS. 16-24 are cross-sectional views of a semiconductor device according to one or more steps of the method of FIG. 15.

Referring to the example of FIG. 16, the substrate 302 is illustrated. The substrate 302 includes a plurality of regions 304, 306, 308, 310, and 312. In an embodiment, the first region 304 is a region in which one of an N-channel field effect transistor (nFET) and P-channel FET (pFET) devices may be formed; the second region 306 is a region in which the other one of an N-channel field effect transistor (nFET) and P-channel FET (pFET) devices may be formed. For example, in a further embodiment, the first region 304 provides an NMOS or nFET region; the second region 306 provides a PMOS or pFET region, or vice versa. The regions 308 and 310 may be representative of input/output device regions of the substrate 302. In an embodiment, the region 308 is a region in which one of an N-channel field effect transistor (nFET) I/O device and P-channel FET (pFET) I/O device may be formed; the region 310 is a region in which the other one of an N-channel field effect transistor (nFET) I/O device and P-channel FET (pFET) I/O device may be formed. The region 312 may provide a region where a high-resistance device (e.g., high-R FET) may be formed. The substrate 302 further includes isolation features 314. The isolation features 314 are illustrated as STI features, however other embodiments are possible.

The method 1500 then proceeds to block 1504 where an input/output (I/O) oxide layer is formed on the substrate. The I/O oxide layer may include silicon dioxide. In an embodiment, the I/O oxide is a thermally grown oxide. Block 1504 may be substantially similar to block 204, described above with reference to FIG. 2. The method 1500 then proceeds to block 1506 where the I/O oxide layer is patterned. The I/O oxide layer may be patterned using suitable photolithography processes such as, depositing a photosensitive material layer, exposing the photosensitive material layer to a pattern and developing the exposed material to form a masking element. The masking element may be used to protect an I/O region or I/O regions of the substrate, while the I/O oxide is removed from other regions. The I/O oxide may be removed using suitable etching processes such as, wet etch or dry etch processes. Block 1506 may be substantially similar to block 206, described above with reference to FIG. 2. Referring to the example of FIG. 16, a patterned I/O oxide layer 316 is provided on the substrate 302 in regions 308 and 310. The regions 308 and 310 may be associated with I/O devices.

The method 1500 then proceeds to block 1508 where an interfacial layer is formed on the substrate. The interfacial layer may include a silicon oxide layer ($SiO_2$) or silicon oxynitride (SiON). The thickness of the interfacial layer may be between approximately 5 to 10 angstroms (A). In an embodiment, the interfacial layer is grown by an oxidation process. For example, the interfacial layer may be a thermally grown oxide. In such an embodiment, the interfacial layer is formed only the exposed portions of the substrate (e.g., silicon) and the I/O oxide is not increased in thickness nor is an interfacial layer formed on the I/O oxide. Block 1508 may be substantially similar to block 208, described above with reference to FIG. 2. Referring to the example of FIG. 16, an interfacial layer 502 is formed on the substrate 302.

The method 1500 then proceeds to block 1510 where a gate dielectric layer is formed on the substrate. In an embodiment, the gate dielectric layer is a high-k dielectric material. The gate dielectric material may be formed by atomic layer deposition (ALD) or other suitable technique. The gate dielectric layer may include a thickness ranging from approximately 10 to 40 A. The gate dielectric layer may include hafnium oxide ($HfO_2$). Alternatively, the layer may include other high-k dielectrics, such as $TiO_2$, HgZrO, $Ta_2O_3$, $HfSiO_4$, $ZrO_2$, $ZrSiO_2$, combinations thereof, or other suitable material. Further, the gate dielectric layer may include a multiple layer configuration. The formation of the gate dielectric layer may include treating the as-deposited layer, for example with a post-nitridation annealing (PNA), direct plasma nitridation (DPN), and/or other suitable treatment processes that may improve the quality of the dielectric layer. Referring to the example of FIG. 16, a gate dielectric layer 802 is formed on the substrate 302. In an embodiment, the gate dielectric layer 802 is a high-k dielectric.

The method 200 then proceeds to block 1512 where a tri-layer element is formed on the gate dielectric layer. The tri-layer element may be substantially similar to as discussed above with reference to block 106 of the method 100, described with respect to FIG. 1, and/or block 216 of the method 200, described above with respect to FIG. 2. The tri-layer element may include a metal gate layer interposing two capping layers. The metal gate layer may also be referred to as a work function layer. In an embodiment, the tri-layer element is associated with a first type of work function (e.g., opposite the capping layer of block 1520, described below).

In an embodiment, the tri-layer element includes a p-type (pFET) capping layer, a metal gate and a second p-type (pFET) capping layer. Exemplary compositions for the p-type capping layer include $Al_xO_y$, such as $Al_2O_3$. Exemplary compositions for a metal gate layer include TiN. Alternatively, the metal gate layer may include TaN, $ZrSi_2$, $MoSi_2$, $TaSi_2$, $NiSi_2$, WN, or other suitable material. However, other type of P work function metal (p-metal) compositions may be used. P-type metal materials include compositions such as ruthenium, palladium, platinum, cobalt, nickel, and conductive metal oxides, and/or other suitable materials.

In another embodiment, the tri-layer element includes an n-type (nFET) capping layer, a metal gate and a second n-type (nFET) capping layer. Exemplary compositions for the n-type capping layer include $La_xO_y$, such as $La_2O_3$. Exemplary compositions for a metal gate layer include TiN. Alternatively, the metal gate layer may include TaN, $ZrSi_2$, $MoSi_2$, $TaSi_2$, $NiSi_2$, WN, or other suitable material. However, other type of N work function metal (n-metal) may be used. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

The tri-layer element may be formed using atomic layer deposition (ALD), physical vapor deposition (PVD), chemical vapor deposition (CVD), and/or other suitable process. The thickness of each capping layer may be less than approximately 50 A. The thickness of the metal gate layer may be less than approximately 200 A.

Figure 17:
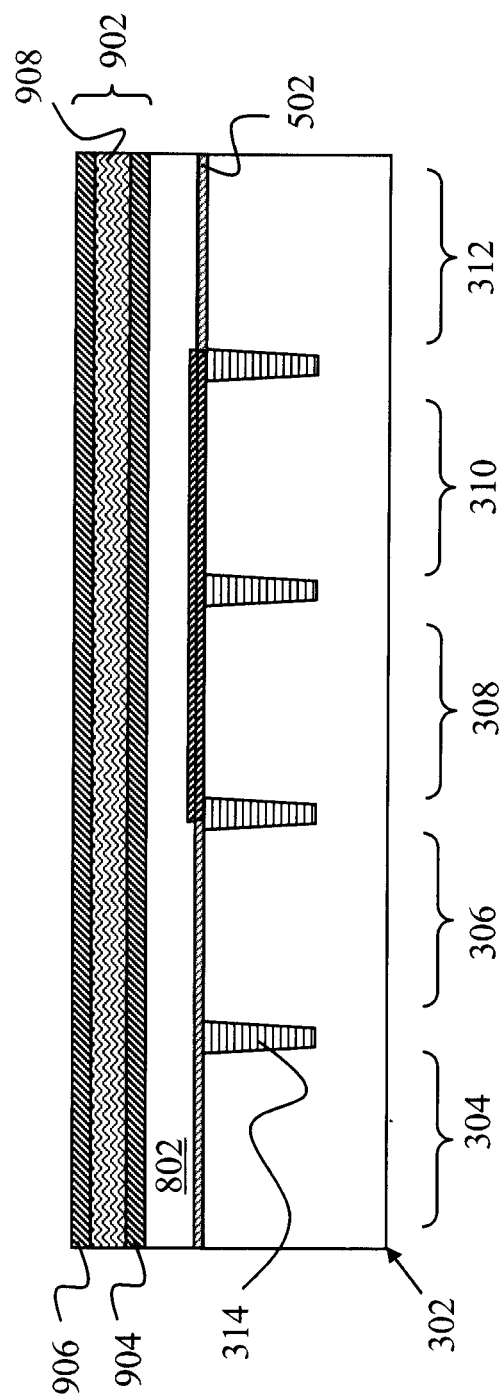

Referring to the example of FIG. 17, a tri-layer element 902 is disposed on the substrate 302. The tri-layer element 902 includes a capping layer 904 and a capping layer 906, and a metal gate layer 908 interposes the first and second capping layers 904 and 906.

The method 1500 then proceeds to block 1514 where a first (or upper) capping layer of the tri-layer element is patterned. The first capping layer of the tri-layer element may be patterned using suitable photolithography processes such as, depositing a photosensitive material layer, exposing the photosensitive material layer to a pattern, and developing the exposed material to form a masking element. The masking element may be used to protect one type of region (e.g., the region(s) for the formation of one of nFET or pFET devices), while the first capping layer is removed from other region(s) (e.g., the regions for the formation of the other one of nFET or pFET devices). Portions of the capping layer may be removed using suitable etching processes such as, wet etch or dry etch processes.

Figure 18:
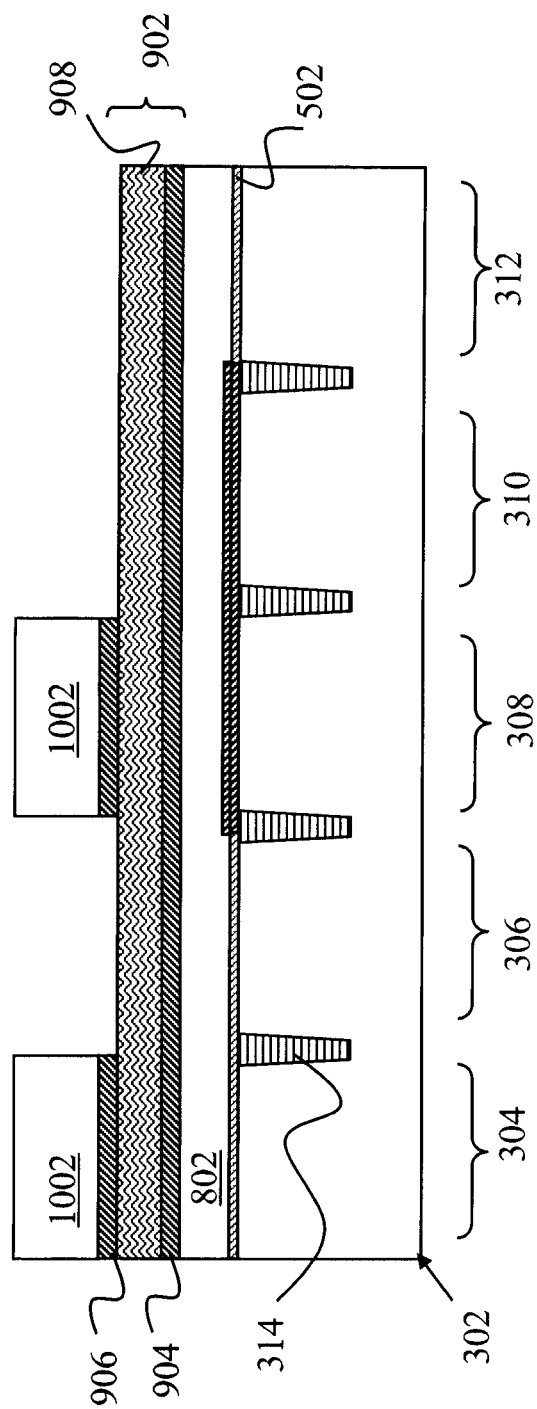

Referring to the example of FIG. 18, a masking element 1002 is formed on the capping layer 906 and overlies the region 304 and the region 308. In an embodiment, the regions 304 and 308 are associated with a first type of device, while regions 306 and 310 are associated with a second type of device. For example, in an embodiment, region 306 is an nFET device region and region 310 is an I/O nFET device region. In another embodiment, region 306 is a pFET device region and region 310 is an I/O pFET device region. The capping layer 906 is removed from regions 306, 310, and 312. The masking element 1002 may include photoresist.

The method 1500 then proceeds to block 1516 where a metal gate layer of the tri-layer element is patterned. The metal gate layer may be patterned using the patterned overlying capping layer as a masking element. In an embodiment, a photosensitive material used to pattern the upper capping layer of the tri-layer element, described above with reference to block 218, is removed from the substrate. Thereafter, the metal gate layer is patterned (e.g., etched) using the patterned upper capping layer as a masking element. The metal gate layer may be patterned using suitable wet etch, dry etch, plasma etch, and/or other suitable processes. The patterned metal gate layer may overlie regions of the substrate having a first device type (e.g., one of nFET or pFET), while the metal gate layer is removed from regions of the substrate having a second device type (e.g., the other one of pFET and nFET).

Figure 19:
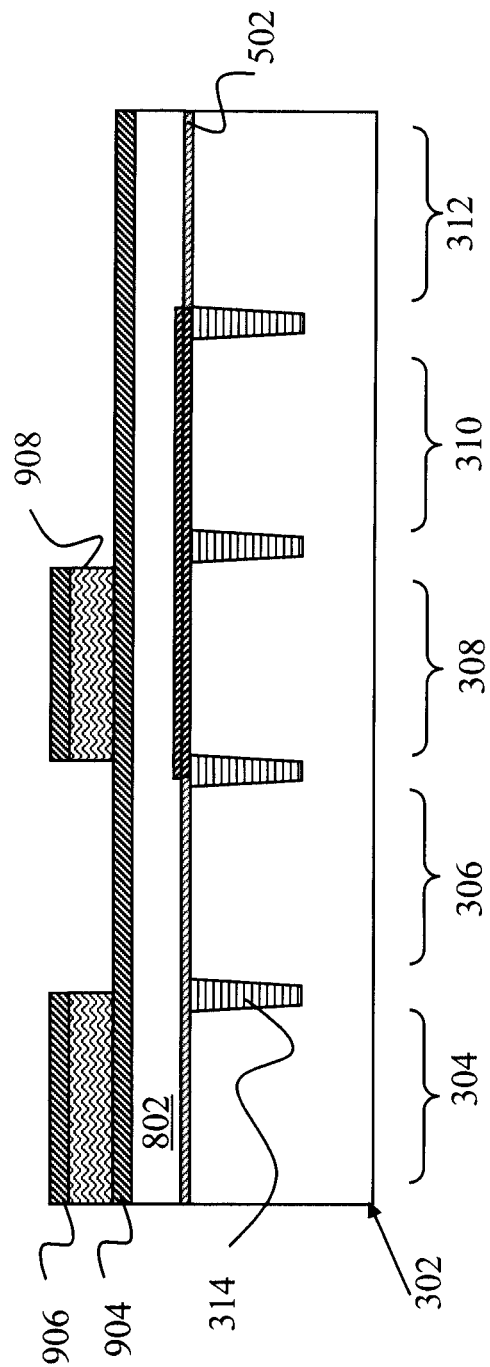

Referring to the example of FIG. 19, the metal gate layer 908 is patterned. The metal gate layer 908 may be patterned using the patterned upper capping layer 906 as a masking element. Thus, the metal gate layer 908 now overlies regions 304 and 308, and has been removed from other regions of the substrate 302, including regions 306 and 310. In an embodiment, the regions 306 and 310 are associated with a first type of device, while regions 304 and 308 are associated with a second type of device. For example, in an embodiment, region 306 is an nFET device region and region 310 is an I/O nFET device region; region 304 is a pFET device region and region 308 is an I/O pFET region. In another embodiment, region 306 is a pFET device region and region 310 is an I/O pFET device region; region 304 is an nFET device region and region 308 is an I/O nFET region. Thus, the metal gate layer 908 may be selected with a composition beneficial to the device type to be formed in the relevant regions.

The method 1500 then proceeds to block 1518 where an unprotected portion of the capping layer(s) of the tri-layer element is removed from the substrate. In an embodiment, the remaining portion of the upper capping layer of the tri-layer element is stripped from the substrate. In an embodiment, the lower capping layer of the tri-layer element is stripped from the substrate in the regions in which the metal gate is not overlying the lower capping layer, in other words, where the lower capping layer is unprotected or exposed. The lower capping layer may be removed by a wet etch process. In an embodiment, a top capping layer of the tri-layer element is removed from regions of a first type (e.g., one of nFET and pFET regions) while the bottom capping layer of the tri-layer element is removed from the regions of a second type (e.g., the other one of the nFET and pFET regions). The removal may be provided substantially simultaneously (e.g., with a single wet etch process).

Figure 20:
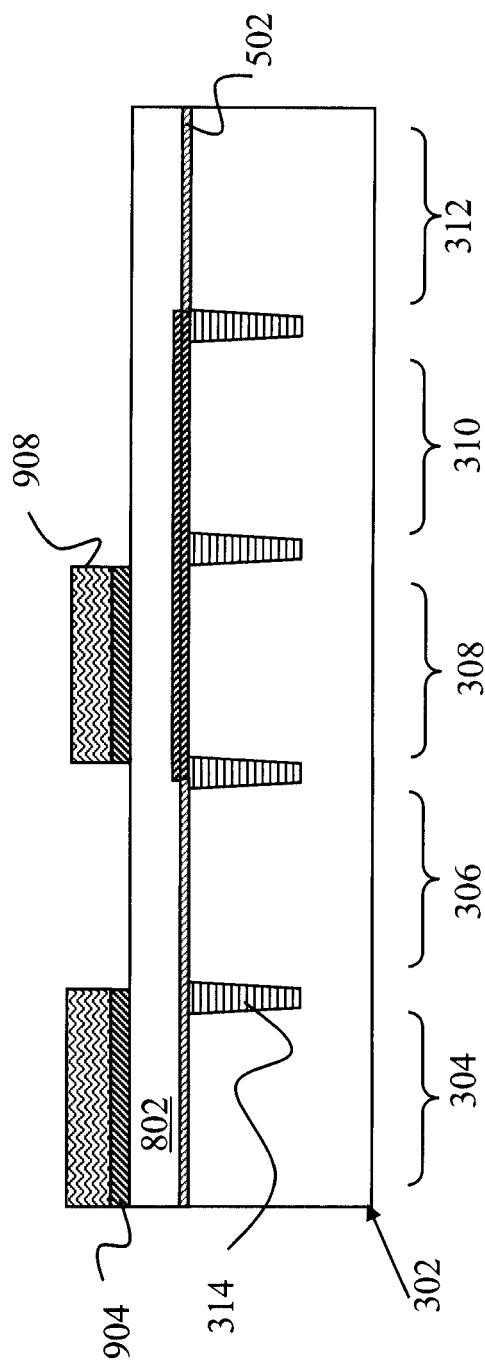

Referring to the example of FIG. 20, the capping layer 906 has been removed from the substrate 302. The capping layer 904 and the metal gate layer 908 are disposed on the substrate in regions 304 and 308. As described above, in an embodiment, the regions 306 and 310 are associated with a first type of device, while regions 304 and 308 are associated with a second type of device. For example, in an embodiment, region 306 is an nFET device region and region 310 is an I/O nFET device region; region 304 is a pFET device region and region 308 is an I/O pFET region. In another embodiment, region 306 is a pFET device region and region 310 is an I/O pFET device region; region 304 is an nFET device region and region 308 is an I/O nFET region.

The method 1500 then proceeds to block 1520 where another capping layer is formed on the substrate. The capping layer of block 1502 may be associated with a second type of work function, different than the work function of the tri-layer element. In an embodiment, the capping layer is an n-type material. Exemplary n-type capping materials include $La_xO_y$ (e.g., $La_2O_3$). In an alternative embodiment, the capping layer is a p-type material. Exemplary p-type capping materials include aluminum oxide ($Al_xO_y$). The capping layer may be less than approximately 50 A in thickness. The capping layer may be formed using atomic layer deposition (ALD), physical vapor deposition (PVD), chemical vapor deposition (CVD), and/or other suitable processes. Other possible compositions of the capping layer may include LaSiO, TiAlN, TaN, TaC, TiN, TaSi, TiAl, combinations thereof, and/or other suitable material.

Figure 21:
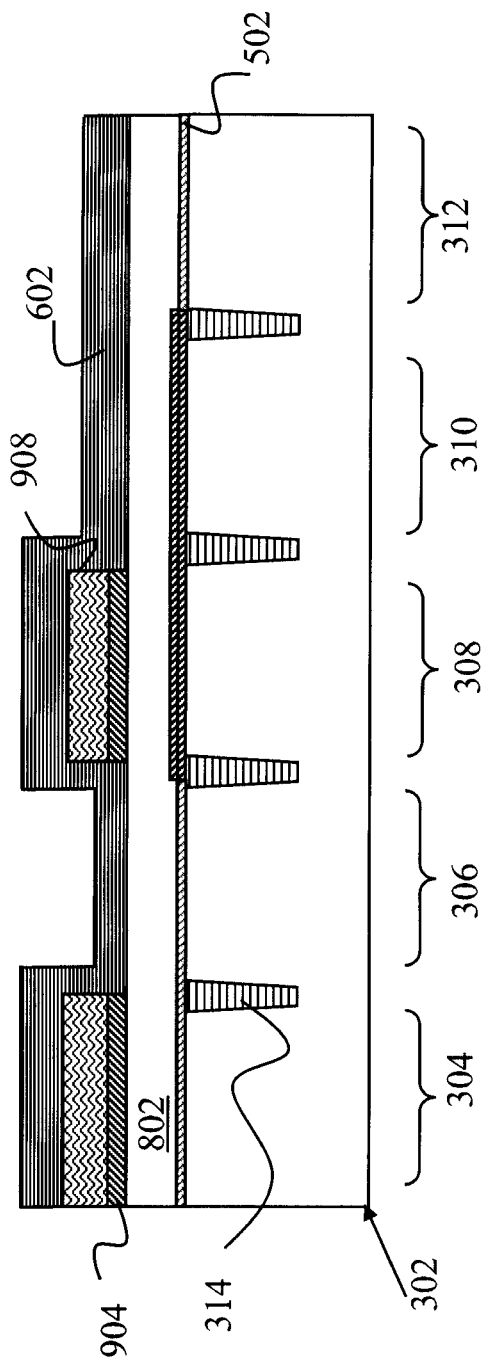

Referring to the example of FIG. 21, a capping layer 602 is formed on the substrate 302. In an embodiment, the capping layer 602 is an n-type layer such as $La_xO_y$. In another embodiment, the capping layer 602 is a p-type layer such as $Al_xO_y$.

The method 1500 then proceeds to block 1522 where the capping layer of the second type is patterned. The capping layer may be patterned using suitable photolithography processes such as, depositing a photosensitive material layer, exposing the photosensitive material layer to a pattern and developing the exposed material to form a masking element. The masking element may be used to protect one type of region (e.g., the region(s) for the formation of one of nFET or pFET devices), while the capping layer is removed from other region(s) (e.g., the regions for the formation of the other one of nFET or pFET devices). The capping layer may be removed using suitable etching processes such as wet etch or dry etch processes.

Figure 22:
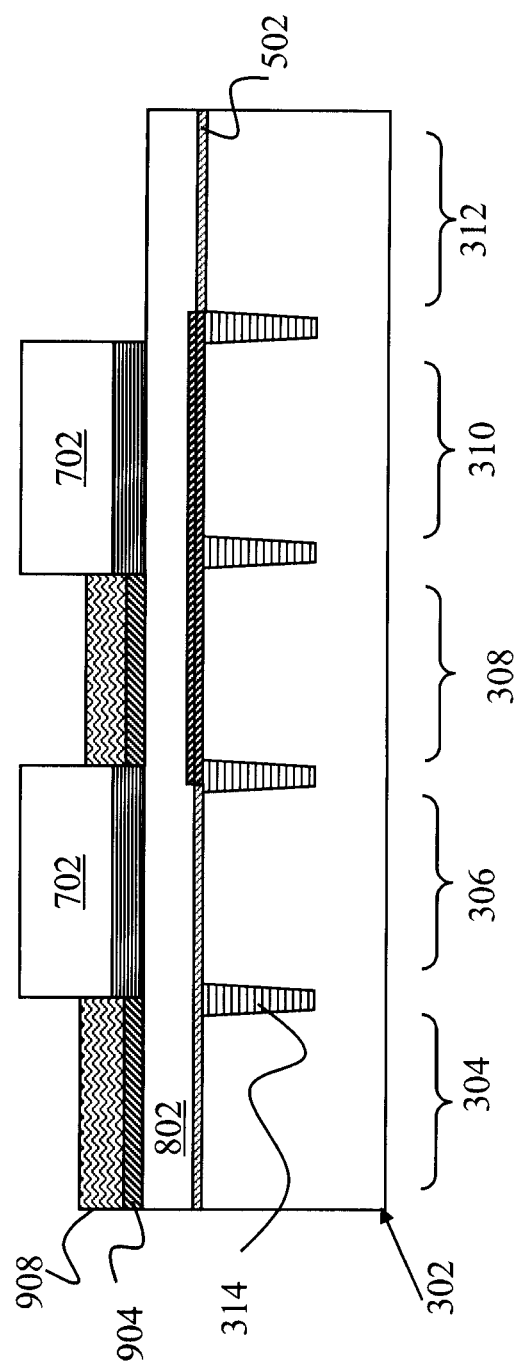
Figure 23:
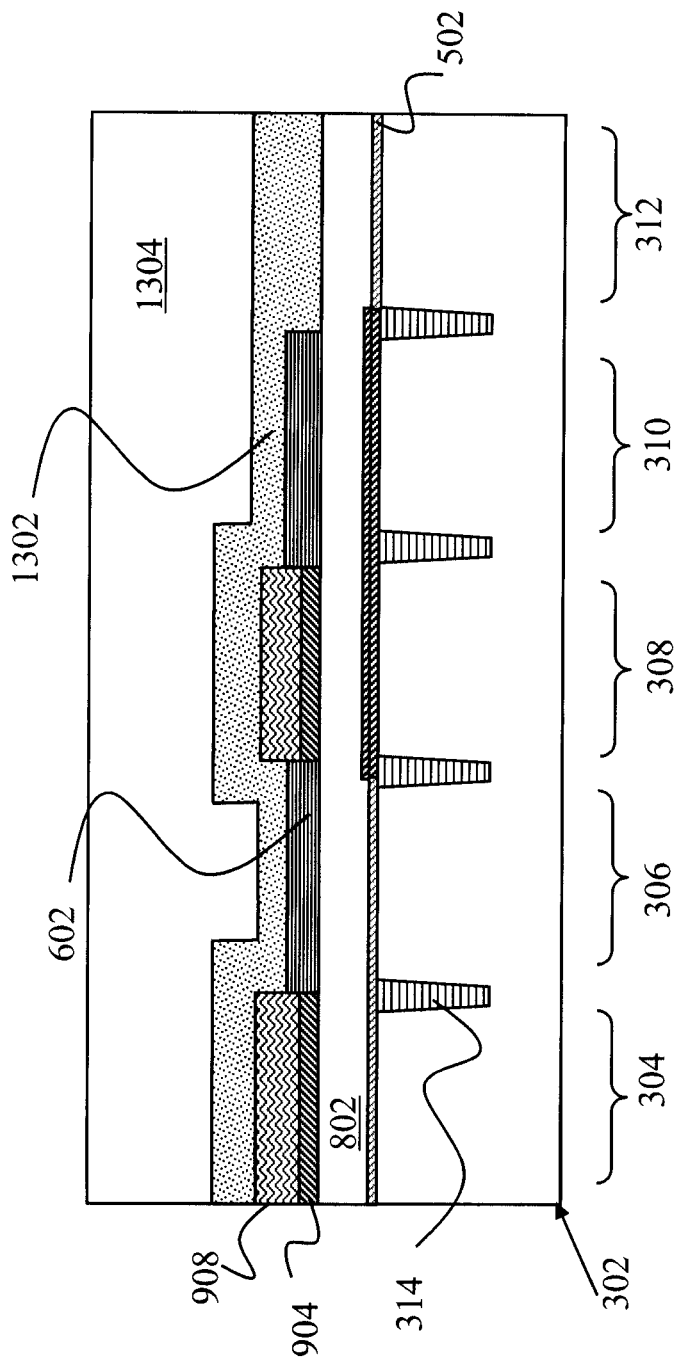

Referring to the example of FIG. 22, a masking element 702 overlies the region 306 and the region 310. In an embodiment, the regions 306 and 310 are associated with a first type of device, while regions 304 and 308 are associated with a second type of device. For example, in an embodiment, region 306 is an nFET device region and region 310 is an I/O nFET device region. In another embodiment, region 306 is a pFET device region and region 310 is an I/O pFET device region. The capping layer 602 is removed from regions 304, 308, and 312. Thus, the capping layer 602 may be selected with a composition beneficial to the devices formed in the relevant regions. The masking element 702 may include photoresist.

Thus, in an embodiment of the device 1600, the capping layer 602 is a pFET capping layer (e.g., $Al_xO_y$) and the capping layers 904 and 906 of the tri-layer element 902 are nFET capping layers (e.g., $La_xO_y$). In another embodiment, the capping layer 602 is an nFET capping layer (e.g., $La_xO_y$) and the capping layers 904 and 906 are pFET capping layers (e.g., $Al_xO_y$).

The method 1500 then proceeds to block 1524 where the remaining layers of the gate structure(s) are formed. The layers formed may include additional work function layers, polysilicon layers, and/or other suitable layers. In an embodiment, the work function layer may include a metal gate layer associated with a different device type than the metal gate layer of the tri-layer element. For example, in an embodiment, the tri-layer element is associated with an nFET and includes n-metal, and the work function layer of block 1524 is associated with a pFET and includes a p-metal. In another embodiment, the tri-layer element is associated with a pFET and includes p-metal, and the work function layer of block 1524 is associated with an nFET and includes an n-metal. Exemplary compositions for the work function layer may include TiN, TaN, $ZrSi_2$, $MoSi_2$, $TaSi_2$, $NiSi_2$, WN, and/or other suitable material. The polysilicon layer may be a sacrificial layer, or may remain on the substrate to form a portion of the gate structure. Referring to the example of FIG. 23, a work function layer 1302 and a polysilicon layer 1304 are formed on the substrate 302.

The method 1500 then proceeds to block 1526 where the gate structures are patterned. The gate structures may be patterned using suitable photolithography processes such as, depositing a photosensitive material layer, exposing the photosensitive material layer to a pattern and developing the exposed material to form a masking element. The underlying layers are then etched to form gate structures.

In an embodiment, forming the gate structures includes depositing a hard mask layer on the gate stack layers. The hard mask may be formed by a deposition process or other suitable process. The hard mask may include silicon nitride, silicon oxynitride, silicon carbide, or other suitable material. The hard mask may include a thickness ranging from approximately 100 to about 300 A. Referring to the example of FIG. 24, a hard mask layer 1402 is formed on the gate layers.

Figure 24:
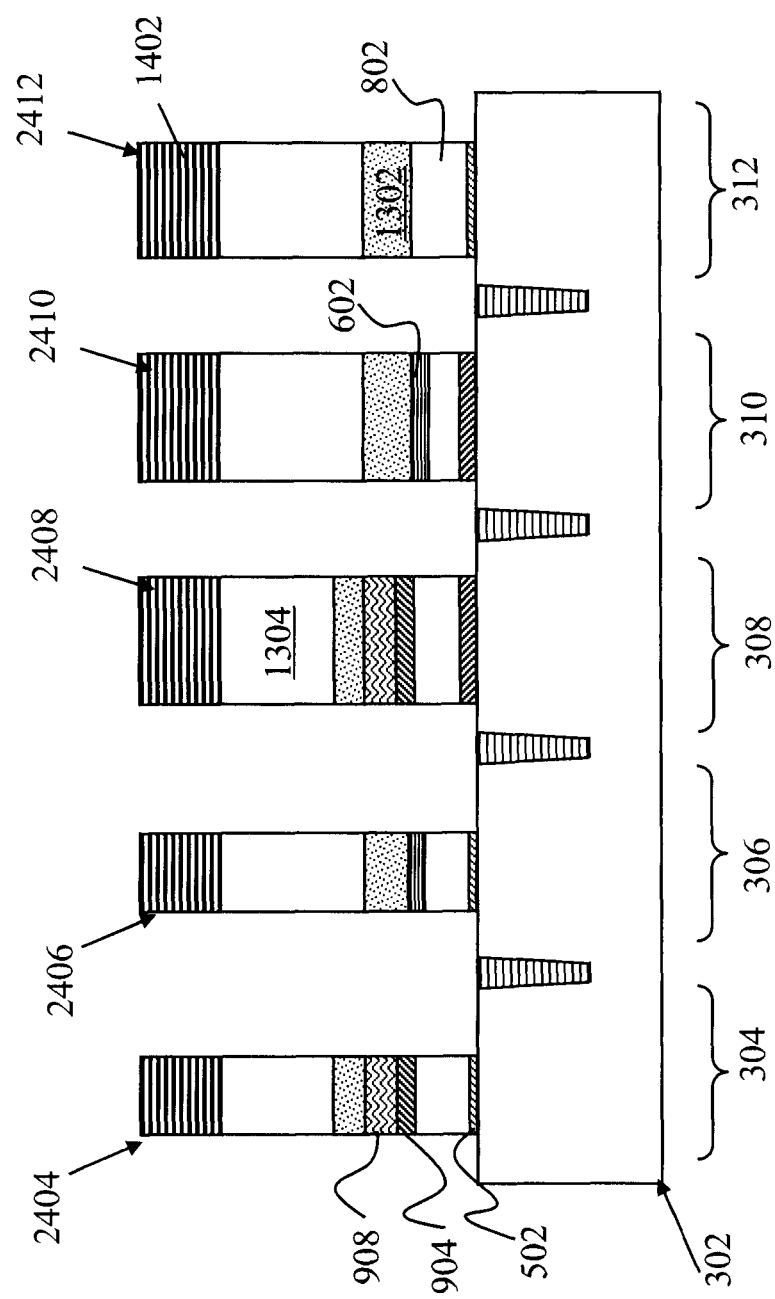

FIG. 24 also illustrates a plurality of gate structures 2404, 2406, 2408, 2410, and 2412. In an embodiment, gate structure 2404 and gate structure 2408 are associated with a first device type; gate structures 2406 and gate structures 2410 are associated with a second device type. In an embodiment, the first device type is one of nFET and pFET and the second device type is the other of nFET and pFET. In an embodiment, the gate structures 2408 and 2410 are associated with input/output (I/O) devices. The gate structure 2412 may be associated with a high resistance resistor.

The device 1600 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 1500 may continue to provide other features and elements fabricated by CMOS process technology flow. For example, source/drain regions associated with each of the gate structures may be formed. Interlayer dielectric (ILD) layers may be formed on the substrate on the source/drain regions and interposing the gate structures. The substrate may be planarized, the hard mask removed. Further exemplary processes that may be performed include the formation of contact features coupled to the gate structures and a multi-layer interconnect (MLI) structure having via and interconnect lines that may interconnect one or more gate structures or semiconductor devices formed on the substrate. It is noted that the method 1500 may be describes as a portion of a gate-first process of fabricating metal gates. However, one of ordinary skill in the art may recognize aspects of the method 1500 that benefit a replacement gate, or gate last process.

In summary, the methods and devices disclosed herein that provide for metal gate semiconductor devices having differently configured metal gate structures formed on a single substrate. It is understood that different embodiments disclosed herein offer different disclosure, and that they may make various changes, substitutions and alterations herein without departing from the spirit and scope of the present disclosure.

Thus, provided is a method of semiconductor device fabrication including providing a substrate having a gate dielectric layer such as a high-k dielectric disposed thereon. A tri-layer element is formed on the gate dielectric layer. The tri-layer element includes a first capping layer, a second capping layer, and a metal gate layer interposing the first and second capping layer. One of an nFET and a pFET gate structure are formed using the tri-layer element, for example, the second capping layer and the metal gate layer may form a work function layer for one of an nFET and a pFET device. The first capping layer may be a sacrificial layer used to pattern the metal gate layer.

In another embodiment, a method of semiconductor device fabrication is provided that includes providing a substrate and forming a high-k dielectric layer on the substrate. A plurality of layers are formed on the high-k dielectric layer including a first capping layer, a second capping layer, and a metal gate layer interposing the first and second capping layers. The first capping layer is patterned. Using the patterned first capping layer, the metal gate layer is patterned into a first feature and a second feature. The first and second capping layers are then etched such that the second capping layer is disposed under the first and second feature of the metal gate layer and the first capping layer may be removed from the substrate. A gate structure is formed that includes the high-k dielectric layer, the first feature of the metal gate layer, and the second capping layer. The gate structure may be an nFET device or a pFET device. The gate structure may further be an I/O nFET device or I/O pFET device.

In embodiments, the method may further include forming a third capping layer, underlying the high-k dielectric layer. In an alternative embodiment, a third capping layer is formed after etching the first and second capping layers, which overlies the high-k gate dielectric layer. The third capping layer may provide a work function associated with one of an nFET device and a pFET device, while the first and second capping layers provide a work function associated with the other one of an nFET and pFET device.

In embodiments, forming the gate structure including the first feature and the second capping layer is performed on a first region of the substrate and a second gate structure is formed on a second region of the substrate. The second gate structure may include the high-k dielectric layer and a third capping layer. The second gate structure (and the first gate structure) may further include a work function layer. The work function layer may be deposited on the metal gate layer of the first gate structure. The second gate structure may also include the work function layer.

In yet another embodiment, a method of semiconductor device fabrication is provided that includes having a substrate having a gate dielectric layer on the substrate. A first layer comprising at least one of lanthanum oxide and aluminum oxide is formed on the substrate. A metal gate layer is formed on the first layer. A second layer comprising at least one of lanthanum oxide and aluminum oxide is then formed on the metal gate layer. The second layer is patterned such that the second layer is disposed on a first region of the substrate. The metal gate layer is etched using the patterned second layer as a masking element. The etched metal layer is disposed in the first region of the substrate. After etching the metal gate layer, the second layer is removed from the first region of the substrate and concurrently, the first layer is removed from a second region of the substrate. A first gate structure is then formed in the first region, wherein the first gate structure includes the gate dielectric layer, the metal gate layer and the first layer.

In embodiments, the first gate structure is one of an nFET and pFET gate structure. The method may further include depositing a third layer on the gate dielectric layer in the second region of the substrate. A second gate structure is formed in the second region. The second gate structure includes the gate dielectric layer and the third layer. The second gate structure provides one of an nFET and a pFET gate structure and the first gate structure provides the other one of an nFET and a pFET gate structure. For example, the first and second layer may include one of lanthanum oxide and aluminum oxide and the third layer may include the other one of lanthanum oxide and aluminum oxide.

What is claimed is:

1. A method, comprising:
providing a substrate;
forming a third capping layer on the substrate;
patterning the third capping layer;
forming a gate dielectric layer on both the substrate and the patterned third capping layer;
forming a tri-layer element on the gate dielectric layer, wherein the tri-layer element includes a first capping layer, a second capping layer, and a metal gate layer interposing the first and second capping layers; and
forming at least one of an nFET and a pFET gate structure using the tri-layer element.

2. The method of claim 1, wherein the forming the gate structure using the tri-layer element includes patterning the first capping layer and using the patterned first capping layer as a masking element to pattern the metal gate layer.

3. The method of claim 1, further comprising:
removing the first capping layer from the substrate.

4. The method of claim 1, wherein the forming at least one of an nFET and pFET gate structure includes forming the gate structure having the metal gate layer and the second capping layer.

5. The method of claim 1, wherein the forming the gate structure includes forming the nFET gate structure having the gate dielectric layer, the metal gate layer and the second capping layer.

6. The method of claim 1, wherein the forming the gate structure includes forming an input/output (I/O) gate structure having an I/O oxide layer, the metal gate layer and the second capping layer.

7. A method of semiconductor device fabrication, comprising:
providing a substrate;
forming a high-k dielectric layer on the substrate;
forming a plurality of layers on the high-k dielectric layer including a first capping layer, a second capping layer, and a metal gate layer interposing the first and second capping layers;
patterning the first capping layer;
using the patterned first capping layer to pattern the metal gate layer to provide a first feature;
concurrently etching the first and second capping layers thereby removing the first capping layer in a first region of the substrate and removing the second capping layer in a second region of the substrate different from the first region, wherein, after the etching, the second capping layer is disposed under the first feature of the metal gate layer; and
forming a gate structure including the high-k dielectric layer, the first feature of the metal gate layer, and the second capping layer, wherein the gate structure is associated with one of an nFET and a pFET.

8. The method of claim 7, further comprising:
forming a third capping layer on the substrate before the forming of the high-k dielectric layer.

9. The method of claim 8, wherein the third capping layer provides a work function associated with one of an nFET device and a pFET device, and wherein the second capping layer provides a work function associated with the other one of an nFET and pFET device.

10. The method of claim 7, further comprising:
forming a third capping layer after etching the first and second capping layers, wherein the third capping layer overlies the high-k dielectric layer.

11. The method of claim 10, wherein the third capping layer provides a work function associated with one of an nFET device and a pFET device, and wherein the second capping layer provides a work function associated with the other one of an nFET and pFET device.

12. The method of claim 7, wherein the forming the gate structure includes forming an nFET gate structure.

13. The method of claim 7, wherein the forming the gate structure includes forming an input/output nFET gate structure.

14. The method of claim 7, wherein the etching the first capping layer removes the first capping layer from the substrate.

15. The method of claim 7, wherein the forming the gate structure including the first feature and the second capping layer is performed on the first region of the substrate, and wherein a second gate structure is formed on the second region of the substrate, the second gate structure including the high-k dielectric layer and a third capping layer.

16. The method of claim 15, wherein the forming the gate structure further includes depositing a work function layer on the metal gate layer, and wherein the second gate structure further includes the work function layer.

17. A method of semiconductor device fabrication, comprising:
providing a substrate having a gate dielectric layer on the substrate;
forming a first capping layer comprising at least one of lanthanum oxide and aluminum oxide;
forming a metal gate layer on the first capping layer;
forming a second capping layer on the metal gate layer, wherein the second capping layer has substantially the same composition as the first capping layer;
patterning the second capping layer such that the second capping layer is disposed on a first region of the substrate;
etching the metal gate layer using the patterned second ca in layer as a masking element, wherein the etched metal gate layer is disposed in the first region of the substrate;
after etching the metal gate layer, concurrently removing the second capping layer from the first region of the substrate and removing the first capping layer from a second region of the substrate; and
forming a first gate structure in the first region, wherein the first gate structure includes the gate dielectric layer, the metal gate layer and the first capping layer, wherein the first gate structure is one of an nFET and pFET gate structure.

18. The method of claim 17, further comprising:
depositing a third layer on the gate dielectric layer in the second region of the substrate, wherein the third layer is disposed on the gate dielectric layer in the second region of the substrate; and
forming a second gate structure in the second region, wherein the second gate structure includes the gate dielectric layer and the third layer, wherein the second gate structure provides one of an nFET and a pFET gate structure and the first gate structure provides the other one of an nFET and a pFET gate structure.

19. The method of claim 18, wherein the first and second capping layers include one of lanthanum oxide and aluminum oxide and the third layer includes the other one of lanthanum oxide and aluminum oxide.

\* \* \* \* \*